US 6,750,469 B2

(12) United States Patent
Ichihara et al.

(10) Patent No.: US 6,750,469 B2
(45) Date of Patent: Jun. 15, 2004

(54) PHASE CHANGE NONVOLATILE STORAGE DEVICE AND DRIVE CIRCUIT

(75) Inventors: Katsutaro Ichihara, Kanagawa-ken (JP); Hiroaki Yoda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/233,629

(22) Filed: Sep. 4, 2002

(65) Prior Publication Data

US 2003/0067013 A1 Apr. 10, 2003

(30) Foreign Application Priority Data

Sep. 27, 2001 (JP) ........................................ 2001-296102

(51) Int. Cl.$^7$ .............................................. H01L 29/02
(52) U.S. Cl. ........................... 257/2; 315/101; 315/105; 315/163
(58) Field of Search .................. 257/2–4; 365/101–105, 365/163

(56) References Cited

U.S. PATENT DOCUMENTS

| | | | |
|---|---|---|---|
| 5,296,716 A | | 3/1994 | Ovshinsky et al. |
| 6,087,674 A | | 7/2000 | Ovshinsky et al. |
| 2003/0186481 A1 | * | 10/2003 | Lung ........................... 438/95 |
| 2003/0206512 A1 | * | 11/2003 | Ashton ........................ 369/101 |

* cited by examiner

*Primary Examiner*—Wael Fahmy
*Assistant Examiner*—Nathan Ha
(74) *Attorney, Agent, or Firm*—Oblon, Spivak, McClelland, Maier & Neustadt, P.C.

(57) ABSTRACT

In a phase-change nonvolatile storage device using a phase-change material as storage cells, which is improved to overcome a basic problem involved in conventional devices of this type and reliably, easily operable as a storage device, the pre-record state of a storage cell is read before recording information in the storage cell, and a write pulse optimum for transition is selected and applied. If the storage cell need not change in phase, the write pulse need not be applied. Alternatively, the pulse is adjusted in waveform of the trailing edge, depending on whether the storage cell should be changed to the amorphous state or the crystal state, to control the crystallization hold time.

18 Claims, 14 Drawing Sheets a→a transition c→a transition a→c transition c→c transition

PHASE CHANGE NONVOLATILE STORAGE DEVICE AND DRIVE CIRCUIT

CROSS-REFERENCE TO RELATED APPLICATIONS

This application is based upon and claims the benefit of priority from the prior Japanese Patent Application No. 2001-296102, filed on Sep. 27, 2001; the entire contents of which are incorporated herein by reference.

BACKGROUND OF THE INVENTION

This invention relates to a phase-change nonvolatile storage device and its drive circuit, and more particularly to a phase-change nonvolatile storage device for storing and reproducing information by making use of resistance changes of a phase-change material contained in memory cells, and a drive circuit therefor.

Storage devices (memory) are used not only in computer systems but also in any devices and machines such as control systems of social infrastructures including electricity, gas, water, transport and communication services, and it is no exaggeration to say that the modern society does not work without storage devices. Ideal form of storage devices is to fully satisfy a high speed, low bit cost, nonvolatility, low power consumption and high reliability. With no such devices, however, it is the present status to set up a hierarchical memory structure optimum as a system.

Let a hierarchical memory structure of a personal computer be taken as an example. This hierarchical structure is set up with, in the order from the top-level memory: SRAM (static random access memory) for direct dialog with MPU (microprocessing unit), which has an ultra-high speed but has a very high bit unit price; DRAM (dynamic random access memory) that is not so speedy but has a relatively large capacity as solid memory and a lower bit unit price than SRAM; HDD (hard disk drive) that has an access speed lower by as much as several digits than DRAM but sufficiently high as mechanical access speed, large in capacity, low in bit unit price, but not being removable; and optical disk, floppy disk or magnetic tape that is lower in speed than HDD but very low in bit unit price and excellent in medium commutability and reliability.

Thus the current effort with storage devices is to optimize the capability as a system and its price by building such memory hierarchies. However, if an ideal storage device such as almighty memory (universal memory) combining the speed of DRAM and the capacity and nonvolatility of HDD appears, the system design will be greatly simplified, and it will be possible to realize a system having dramatically high capability and inexpensive.

Even when turning the eyes to individual storage devices from such almighty memory, there is the specific issue that DRAMs having led the electronic industry under the nickname "industrial rice" are close to the limit in the movement toward larger capacity. For example, the limit of DRAM and substitutional candidates of storage devices are explained in Nikkei Electronics No. 2001-2-12.

The limit of DRAM is a relative increase of the occupation area of the capacity caused by the continuous increase of the capacity, i.e. continuous miniaturization of memory cells, and it has become difficult to obtain a predetermined capacity (30 fF) with trench structures or stack structures. Candidates of storage devices substitutional for DRAM are three kinds of devices, namely, FeRAM (ferroelectric random access memory), MRAM (magnetoresistive random access memory) and PRAM (phase-change random access memory).

FeRAM stores and holds information by using residual polarization of a ferroelectric material, and its signal quantity is proportional to the quantity of the stored electric charge. Since the quantity of the stored electric charge is proportional to the area of the memory cell, structure of the ferroelectric storage portion of FeRAM is fated to become complicated in the three-dimensional configuration similarly to DRAM along with miniaturization of the memory cells.

MRAM makes use of a magnetoresistance effect. TMR (tunneling magnetoresistance effect) element and CPPGMR (current perpendicular to plane giant magnetoresistance effect) element, exhibiting a relatively large resistance change, are mainly subject to researches. An issue of MRAM is that miniaturization of the element results in an increase of the diamagnetism upon flux reversal and hence an increase of the recording current. Further, although the ratio of its resistance change is relatively large, it is only about 50%.

PRAM is the element that embodiments of the invention intend to handle. This is an element for recording information by using changes of the specific resistance of a phase-change material. Its principle has its origin in the disclosure of U.S. Pat. No. 3,271,591 of 1966 and the disclosure of U.S. Pat. No. 3,530,441, and it is often called Ovonic-memory named after the proponent, Dr. Ovshinsky. The entire contents of these references are incorporated herein by reference.

The principle of its operations is briefly explained below.

If a phase-change material contained in a recording cell is once melted by supplying a recording current of a level forming the amorphous phase to the memory cell, and thereafter quenched to carry over the amorphous state to the room temperature, then the amorphous state can be obtained. On the other hand, when such a phase-change material is annealed by supplying a recording current of a level forming the crystal state, then the phase-change material is crystallized, and the crystal state is obtained. In this manner, one of the amorphous state and the crystal state can be written in each cell.

Reproduction is carried out by supplying a cell with a current smaller than the amorphism-forming level and smaller than the crystallizing level and reading the difference in resistance between the amorphous state and the crystal state as a voltage change or current change. Since some kinds of phase-change materials have differences as large as two to three digits in specific resistance between the amorphous state and the crystal state. Therefore, the quality of reproduction signals therefrom is very high, and it is also possible to technically develop it for many-valued storage.

Structure of a PRAM cell is basically made up of an electrode and a phase-change material, and a diode or a transistor for selecting the cell is connected in series to each cell to form a matrix array. Here is no such problem that the storage portion becomes relatively bulky due to a progress of the cell miniaturization, which is inherent to DRAM and FeRAM. Also the problem of MRAM that miniaturization makes recording difficult does not exist. The phase-change storage portion of PRAM becomes smaller according to the scaling rule along with miniaturization of cells, and the recording current decreases in accordance with the miniaturization.

As such, PRAM has the excellent potential as a substitute for DRAM. Additionally, because of its availability for many-valued recording, it is positioned as a hopeful candidate of the "universal memory" mentioned above. Since the resistance change of PRAM reaches hundreds to thousands times, if 50% resistance changes obtained by MRAM are assigned to two signal levels, it is possible to store information of two hundreds to two thousands values in a single phase-change memory cell. Therefore, With a 1 Gb matrix for two-valued operation, storage of information substantially from 200 Gb to 2Tb will be possible. As such, PRAM must be just a hopeful candidate of universal memory having both the high speed of DRAM and the large capacity of HDD.

Regarding PRAM, improved techniques are disclosed by, in addition to the aforementioned literature, U.S. Pat. No. 5,341,328, U.S. Pat. No. 5,359,205, U.S. Pat. No. 5,534,711, U.S. Pat. No. 5,534,712, U.S. Pat. No. 5,596,522, U.S. Pat. No. 5,687,112 and U.S. Pat. No. 6,087,674, for example. The entire contents of these references are incorporated herein by reference.

SUMMARY OF THE INVENTION

The Inventor, however, made a review on operations of storage devices using phase-change materials, and found a basic problem. Then, through examination of operations of memory cells experimentally prepared on the basis of that knowledge, the Inventor confirmed that the problem the Inventor of the present invention et al. had found was essential, and through further development of new techniques for solving the basic problem, has reached the present invention.

According to an embodiment of the invention, there is provided a drive circuit which drives a phase-change nonvolatile storage device which has a storage cell including a phase-change material variable in phase between a crystal state and an amorphous state, and changes at least a part of said phase-change material of said storage cell in phase between said crystal state and said amorphous state to record information as a first record state corresponding to said crystal state or a second record state corresponding to said amorphous state, said drive circuit comprising: a signal generator which generates a first record signal which changes said storage cell from said first record state to said second record state, and a second record signal which changes said storage cell from said second record state to said first record state; and a reading circuit which reads the record state of said storage cell before recording information in said storage cell, said drive circuit applying said first record signal to said storage cell when said storage cell is in said first record state and should be changed to said second record state, and said drive circuit applying said second record signal to said storage cell when said storage cell is in said second record state and should be changed to said first record state.

With this configuration, an optimum recording signal can be given in accordance with the pre-recording state of the cell, and write in the overwrite mode can be reliably, easily realized.

According to another embodiment of the invention, there is provided a phase-change nonvolatile storage device comprising: a storage cell including a phase-change material variable in phase between a crystal state and an amorphous state, and changes at least a part of said phase-change material of said storage cell in phase between said crystal state and said amorphous state to record information as a first record state corresponding to said crystal state or a second record state corresponding to said amorphous state; and a drive circuit which drives said storage cell, said drive circuit having: a signal generator which generates a first record signal which changes said storage cell from said first record state to said second record state, and a second record signal which changes said storage cell from said second record state to said first record state; and a reading circuit which reads the record state of said storage cell before recording information in said storage cell, said drive circuit applying said first record signal to said storage cell when said storage cell is in said first record state and should be changed to said second record state, and said drive circuit applying said second record signal to said storage cell when said storage cell is in said second record state and should be changed to said first record state.

The "crystallization-holding time" herein means the duration of time for which the phase-change material of the memory cell is held in the crystallizing temperature region between its crystallization temperature Tx and the melting point Tm.

The "crystallization start time" herein means a material parameter of the phase-change material. In case of a nucleation-dominant phase-change material such as GeSb having the composition near the tie line between two metal compound compositions GeTe and $Sb_2Te_3$ on the phase diagram, the crystallization start time τxs is the time where the phase-change material is held in a temperature range not lower than Tx and lower than Tm and generation of crystal nuclei begins. In case of a crystal-growth-dominant phase-change material such as GeSbTe, InSbTe or AgInSbTe, for example, containing a material close to the $Sb_{70}Te_{30}$ eutectic composition as its major component and additionally containing germanium (Ge), indium (In) or silver (Ag), for example, the crystallization start time τxs is the time where the phase-change material is held in a temperature range not lower than Tx and lower than Tm and crystal growth begins from minute crystal nuclei.

The "crystallization finish time" herein means the duration of time required for progress of generation of crystal nuclei and coalescence of crystal nuclei until filling a predetermined portion each cell with crystal grains or for progress of crystal growth until crystallizing a predetermined portion.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings:

FIGS. 10A and 10B are graph diagrams showing intermediate states in the course of raising the temperature, in which FIG. 10A is a graph diagram showing the AB portion of FIG. 12A or JK portion of 13A in an enlarged scale, and FIG. 10B is a graph diagram showing the GH portion of FIG. 12B or MN portion of 13B in an enlarged scale;

DETAILED DESCRIPTION OF THE INVENTION

Figure 1A:
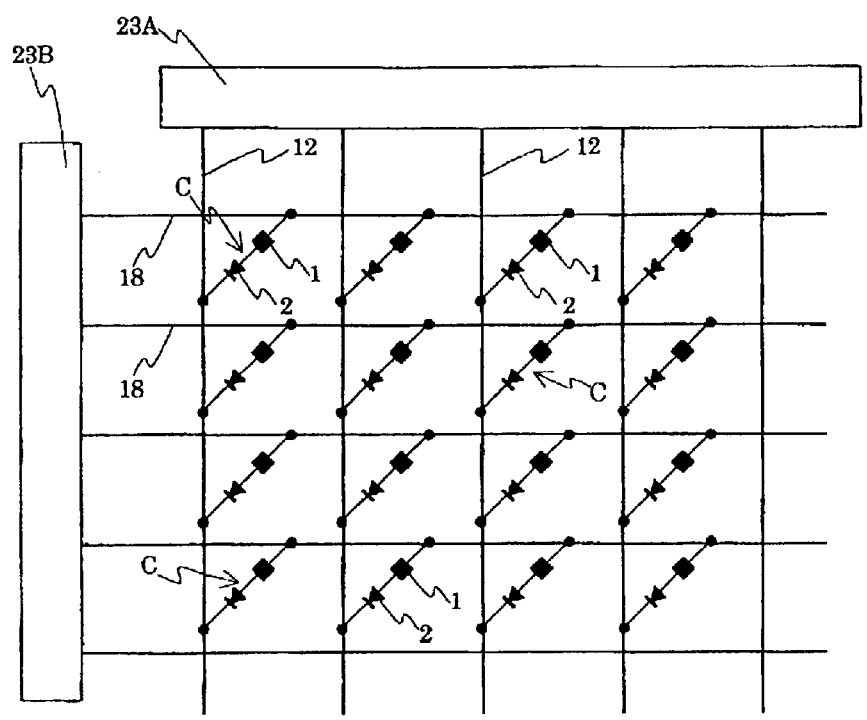
FIGS. 1A and 1B are schematic diagrams each illustrating a configuration of the substantial part of PRAM according to an embodiment of the invention.

First of all, an essential problem the Inventor found regarding operations of conventional PRAM is explained below. Briefly speaking, this is the fact that PRAM techniques disclosed heretofore were difficult to use for writing or recording data in the "overwrite mode". That is, there is not established the formula that, whichever state a pre-recording cell takes, a definitely predetermined amorphism-making power changes or renders the cell amorphous, and a definitely predetermined crystallizing power crystallizes the cell.

Let Ra be assigned to the resistance of a cell in the amorphous state and Rc to the resistance of the cell in the crystal state. For recording, a constant voltage may be applied, or a constant current may be supplied. First explained is the constant-voltage drive mode. Table 1 shows relations among transition from pre-recording states to post-recording states, amorphism-making voltage Va, crystallizing voltage Vc, current Ic flowing to the cell, and power Pc the cell consumes. Here, the letter a indicates the amorphous state and c indicates the crystal state. For example, in Table 1, c→a means transition from the crystal state to the amorphous state.

TABLE 1

| transition | I c | P c |
|---|---|---|
| a → a | V a/R a | V a²/R a |
| c → a | V a/R c | V a²/R c |
| a → c | V c/R a | V c²/R a |
| c → c | V c/R c | V c²/R c |

Recording in the cell is carried out by supplying a current and heating the cell. Temperature T of the cell is proportional to Pc when the loss by heat conduction to outside the cell is disregarded. In Table 1, Ic and Pc represent initial values in the recording process. Actually, however, Ic and Pc change in the recording process in accordance with phase changes as explained later.

As referred to above, here is the relation Ra=(100–1000)× Rc. The basic problem the Inventor found with conventional PRAM relates to the resistance difference between Ra and Rc, and Pc in Table 1, and becomes more and more serious as the difference between Ra and Rc increases. This problem is discussed below, taking the least serious case of Ra=100Rc.

Melting point Tm of a chalcogen-system compound used as the phase-change storage layer and its crystallization temperature Tx depend on the material and composition. In case of $Ge_2Sb_2Te_5$, Tm=600° C. and Tx=160° C.

FIGS. 12A, 12B, 13A and 13B are graph diagrams schematically showing a relation between the cell temperature T (αPc) and the current supply time t in the constant-current mode, i.e. under a constant applied voltage. Each graph shows the temperature change of the cell upon each transition shown in Table 1. In the graphs, the loss by thermal conduction from the phase-change storage layer to its surrounding portions in the temperature-rising process was disregarded for simplicity.

As explained above, overwriting to PRAM was for crystallizing the cell by supplying a definitely predetermined amorphism-forming current pulse to render the cell amorphous or supplying a definitely predetermined crystallizing current pulse to crystallize the cell, regardless of the pre-write state of the cell. That is, Va and Vc are definitely determined, and pulse widths of Va and Vc are also determined definitely.

However, under Ra=100Rc, if an equal voltage is applied for powering, the power consumption in the crystal state (c) reaches one hundred times the power consumption in the amorphous state (a). Therefore, the rising ratio of the cell temperature relative to time by powering is larger in the crystal state by one hundred times than in the amorphous state (a). Since the cell temperature is determined by the product of the power consumption and the time, i.e. the energy given to the cell, if an equal voltage is applied, its results in raising the cell temperature in the crystal state (c) one hundred times faster than the cell temperature in the amorphous state (a). This is explained below in greater detail with reference to FIGS. 12A through 13B.

First explained is amorphous-to-amorphous transition (a→a).

Figure 12A:
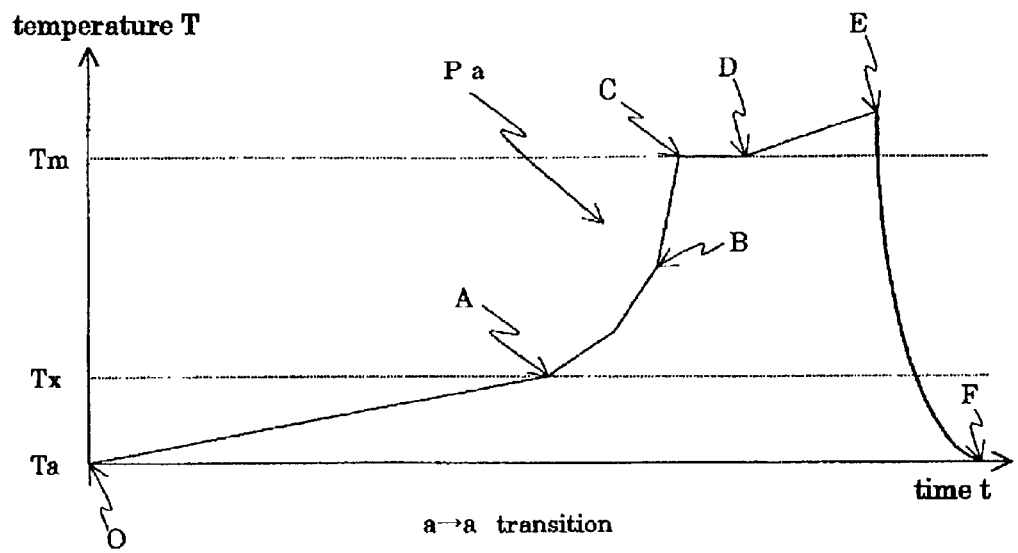
FIGS. 12A and 12B are graph diagrams schematically showing a relation between the cell temperature T (αPc) and the current supply time t in the constant-current mode, i.e. under a constant applied voltage.

FIG. 12A shows the temperature change of the cell upon a→a transition in case the pulse width is relatively long.

Once the cell is powered by application of the amorphism-forming voltage Va, the temperature rises from the point O where the cell is held at the memory operative environment temperature Ta, and reaches the crystallizing temperature Tx at the point A. Since no phase change occurs in the span from Ta to Tx, the power given to the cell remains in the value shown in Table 1. Therefore, the temperature rise from O to A is linear, and the inclination is given by $Pc=Va^2/Ra$ as shown in Table 1.

When the temperature further rises from the point A, the cell gradually crystallizes. The time required for crystallization depends upon the selected material of the phase-change storage layer. Typically, however, it is in the order from sub-nanoseconds to decades of nanosecond. In the way to crystallization, the cell takes an intermediate state from the amorphous state to the crystal state. In this intermediate state, in addition to the state where the amorphous matrix surrounds minute crystal grains as disclosed in conjunction with conventional PRAM, other states the Inventor found may exist, such as the state where substantially columnar crystal pillars or substantially cylindrical crystal cylinders are formed to substantially communicate upper and lower portions of the cell, and amorphous cylinders surround the crystal pillars, or the state where amorphous pillars reside in crystal cylinders.

In any of these sates, resistance of the cell decreases along with crystallization, the current can flow easily, inclination of the temperature rise increases as shown from A to B in FIG. 12A, and the cell crystallizes substantially completely at the point B. If the powering is interrupted in a mid point from the point A to the point B, the intermediate state (where crystals and amorphous portions are mixed) can be formed, and many-value recording is possible.

The temperature rising ratio in the temperature range after passing the point B to under the melting point Tm is $Pc=Va^2/Rc$, and the inclination angle of this path is one hundred times the inclination angle of the path OA. At the point C, the crystallized cell melts. Since the cell needs latent heat for melting, the cell temperature is held, although for a very short time, at the melting point from the point C to the point D. Even in the span from the point C to the point D, the cell takes an intermediate state between the crystal state and the amorphous state. Therefore, if the pulse is interrupted between C and D, the intermediate state (mixed state) between the crystal state and the amorphous state can be formed, and gray recording, i.e. many-value recording, is possible.

At the point D, the cell is molten substantially completely, the temperature rises to the point E by an inclination angle substantially equal to that of the path OA, and the pulse is interrupted. The inclination angle of the path DE is approximately equal to the inclination angle of the path OA because the specific resistance in the molten state is approximately equal to the specific resistance in the amorphous state. The timing for interrupting the pulse may be any time from the point D, and the pulse may be interrupted at the point D as well.

After interruption of the pulse, the cell is cooled rapidly to return to the hold temperature Ta at the point F, and the a→a (amorphous-to-amorphous) recording is completed.

Also in the cooling process of the path EF, the cell passes the temperature range from Tm to Tx. However, in case the time required for passing from the span between Tm and Tx is sufficiently shorter than the time for crystallization of the phase-change storage material, the molten random state is quenched to the hold temperature, recording in the amorphous state is made possible. This means that the time for the cell to stay between Tm and Tx is sufficiently shorter during the time from E to F than during the time from A to B.

Figure 12B:
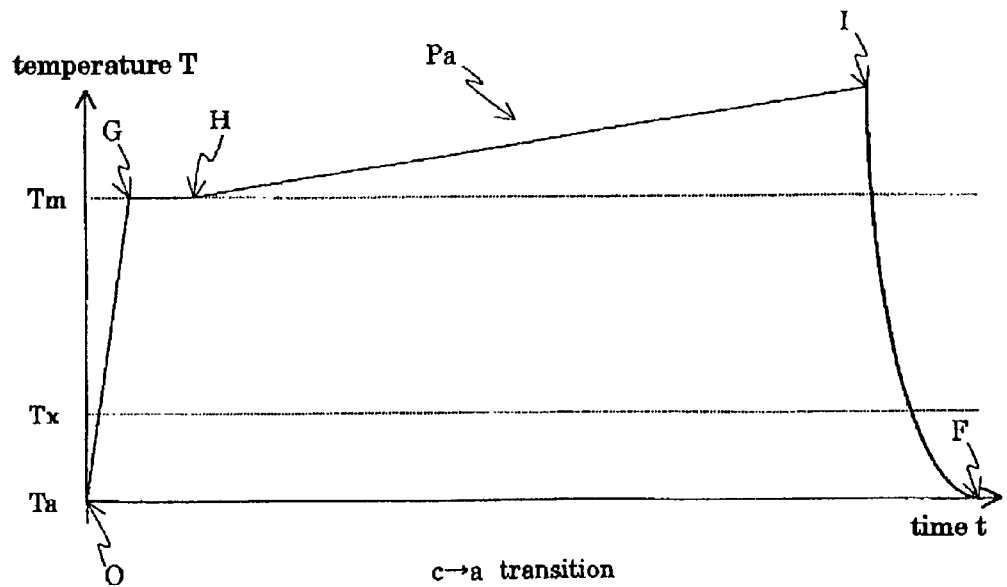

Next referring to FIG. 12B, c→a (crystal-to-amorphous) transition in the constant-voltage mode is explained.

Because this is the recording by forming the amorphous phase, if the overwrite mode is employed, both the recording voltage and the recording pulse width are equal to those for a→a transition.

When Va is applied to the cell in the crystal state at the point O in FIG. 12B, temperature rapidly rises by the inclination angle $Pc=Va^2/Rc$. Since the cell is in the crystal phase, phase change does not occur even after passing Tx, and the temperature linearly rises up to Tm until reaching the point G. Then, the temperature continues rising, through the path GH corresponding to the melting latent heat region, by the moderate inclination angle $Pc=Va^2/Ra$ after the point H, then reaches the point I corresponding to the time for interrupting the pulse in a→a transition, and after interruption of the pulse there, the cell is quenched to complete the c→a recording.

In this case, heating in the time zone from the point H to the point I might be a useless heating time. However, in case of overwrite recording, since the pulse width is the same as that of a→a transition, a loss time is inevitably taken. Additionally, since the temperature at the point I is higher than that at the point E, it results in subjecting the cell to the useless temperature rise and hence degrading the stability of repetitive recording.

Also these matters are problems of conventional PRAM, and the invention overcomes these problems as well. These problems, however, are different from the above-mentioned basic problem. The basic problem the Inventor found is the difficulty of incompatibility of a→c transition and c→c transition.

The difficulty of compatibility of a→c transition and c→c transition found by the Inventor is explained below as the basic problem of conventional PRAM.

Figure 13A:
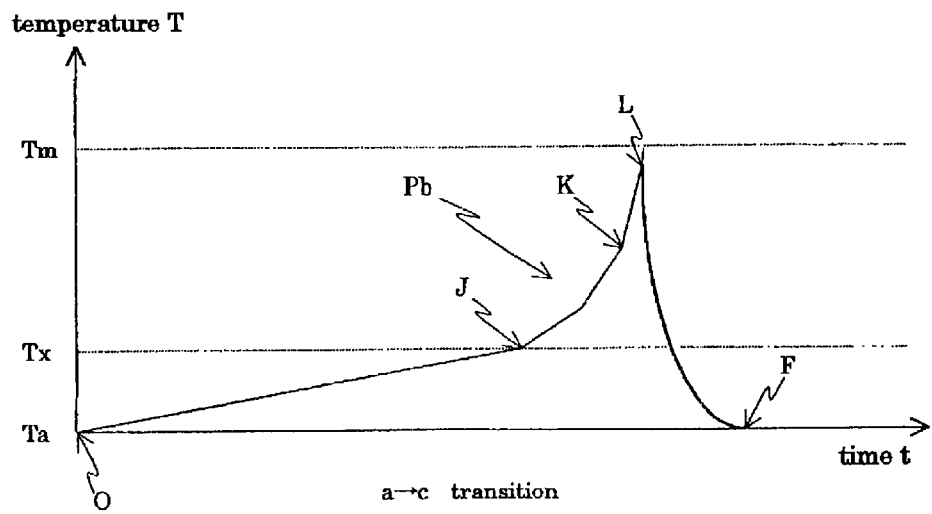
FIGS. 13A and 13B are graph diagrams schematically showing a relation between the cell temperature T (αPc) and the current supply time t in the constant-current mode, i.e. under a constant applied voltage.
Figure 13B:
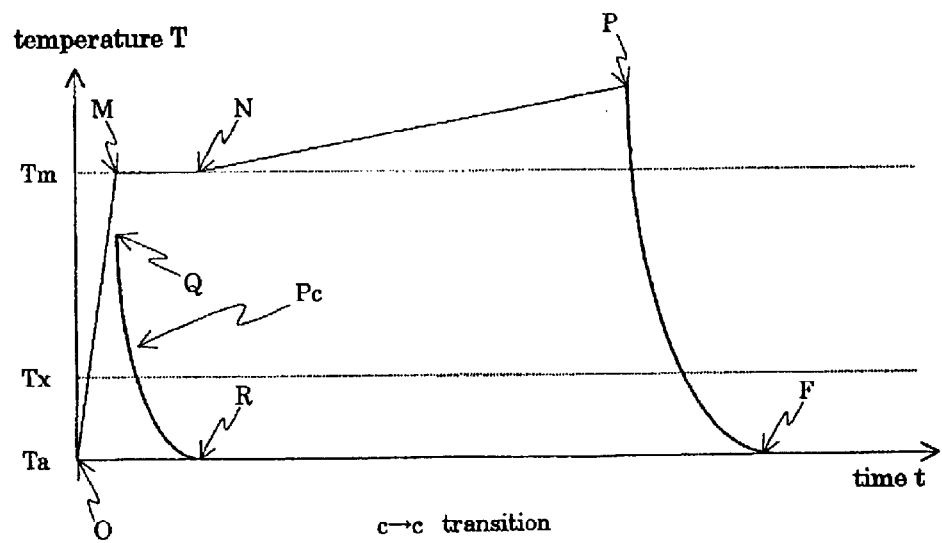

FIGS. 13A and 13B are graph diagrams schematically showing a relation between the cell temperature T (αPc) and the current supply time t in case of bringing about a→c transition and c→c transition in the constant-voltage mode.

Fist explained is a→c transition shown in FIG. 13B.

In this case, because of a very low specific resistance in the crystal state, the time required for the temperature rise from the point O to the point P is very short, and for example approximately one part of tens as compared with the time required for changing from the point O to then point J in the amorphous state shown in FIG. 13A. Therefore, if the voltage is applied only for the time required for completing a→c transition (FIG. 13B) for the purpose of bringing about c→c transition, then the cell reaches the point M and starts melting. The time for reaching the state O to the state M is very short, and if the voltage is applied only for the time equal to the voltage-applying time to directly complete a→c transition, then the cell continues the temperature rise of O→M→N→P, and changes to the amorphous state at the point F by interruption of the pulse. That is, c→a transition undesirably takes place instead of the intended c→c transition.

On the other hand, if the pulse is interrupted at the point Q, for example, to realize c→c transition, the crystal state is carried over to the point R, and c→c transition can be realized. However, application of such a short pulse results in interrupting the pulse before the point J in the a→c transition shown in FIG. 13A and hence failing to realize a→c transition.

That is, as shown in FIGS. 13A and 13B, if both the a→c transition and c→c transition are intended in the constant-voltage mode, the time for applying the voltage pulse largely differs between both transitions, and it is impossible to realize both the a→c transition and the c→c transition by using the same voltage pulse.

Embodiments of the invention are directed to solving the basic problem the conventional PRAM involves.

Heretofore, the basic problem the conventional PRAM involves has been explained, taking one example configured to drive the phase-change cell under a constant voltage.

This problem is not limited only to the constant-voltage drive mode but may occur also in case of driving the phase-change cell under a constant current.

Problems with conventional PRAM upon driving the phase-change cell under a constant current are discussed below to the extent not overlapping the explanation of the above-explained constant-voltage drive.

When a constant current source is used, the cell-end voltage and the cell power consumption responsive to transition of the cell are as shown in Table 2, where Ia is the amorphism-forming current, and Ic is the crystallizing current.

TABLE 2

| transition | V cell | P c |
|---|---|---|
| a → a | R a I a | R a I a$^2$ |
| c → a | R c I a | R c I a$^2$ |
| a → c | R a I c | R a I c$^2$ |
| c → c | R c I c | R c I c$^2$ |

It is appreciated from Table 2 that the power consumption of the cell per unit time in the constant-current operation mode is larger than in the amorphous state than in the crystal state, oppositely from the constant-voltage operation mode.

FIGS. 14A, 14B, 15A and 15B are graph diagrams showing the temperature hysteresis of a cell in each transition under the constant-current drive mode.

Figure 14A:
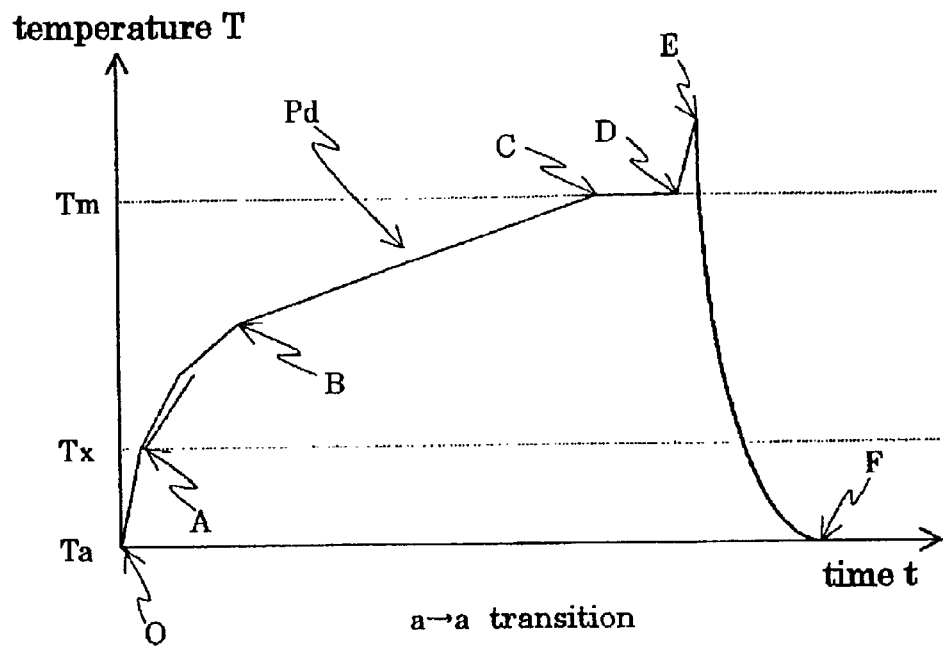
FIGS. 14A and 14B are graph diagrams showing the temperature hysteresis of a cell in each transition under the constant-current drive mode.
Figure 14B:
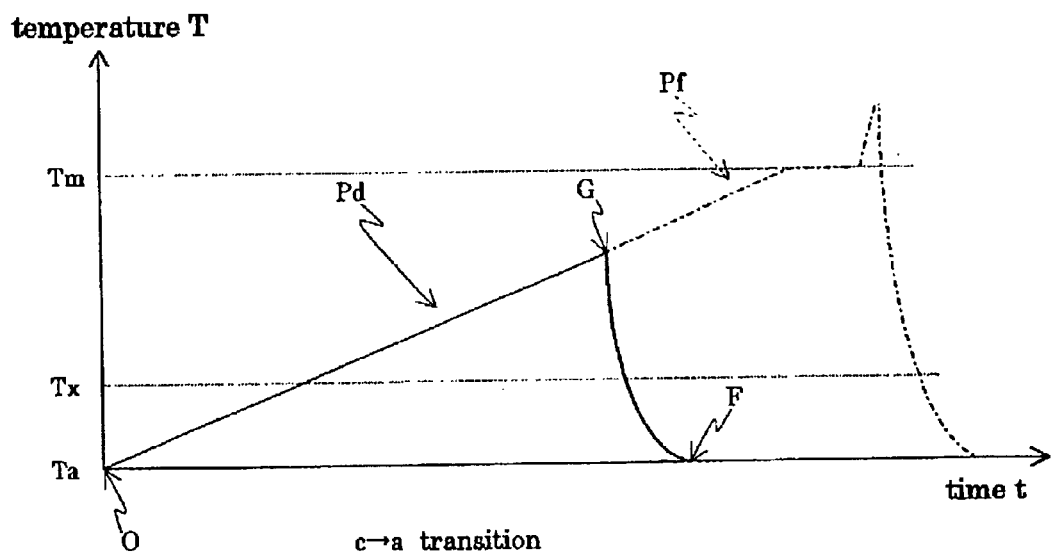
Figure 15A:
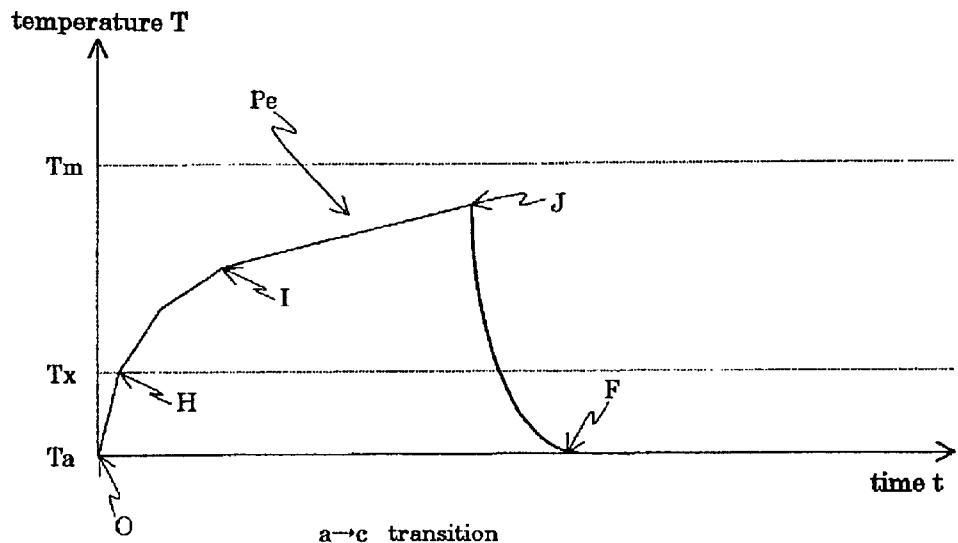
FIGS. 15A and 15B are graph diagrams showing the temperature hysteresis of a cell in each transition under the constant-current drive mode.
Figure 15B:
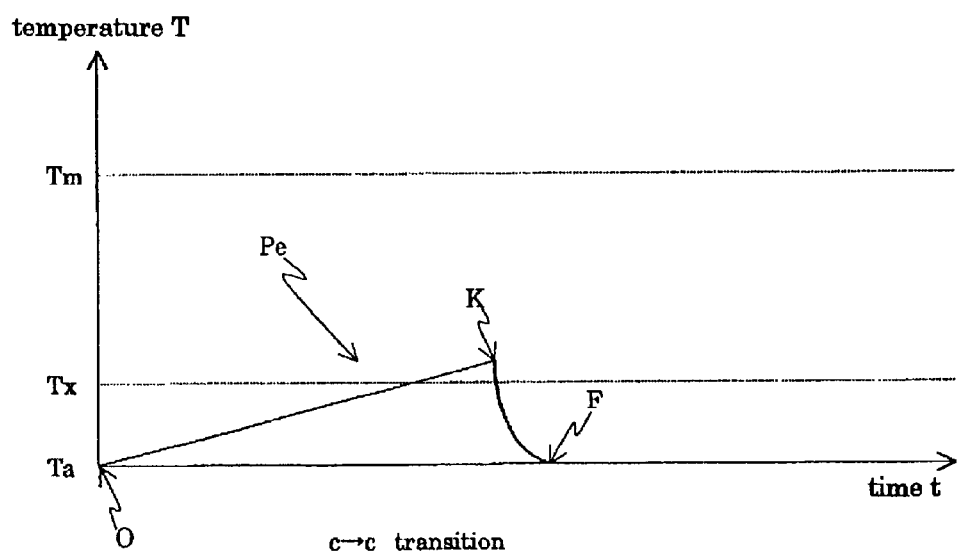

In the constant-current drive mode, both the a→c transition and the c→c transition can occur with an equal current pulse as shown in FIGS. 15A and 15B, but the a→a transition and the c→a transition are difficult to be compatible as shown in FIGS. 14A and 14B.

That is, in the a→a transition, changes occur as shown in FIG. 14A, namely, the temperature rises by the large inclination angle RaIa$^2$ from the point O at the environmental temperature to the point A at the crystallization temperature; gradual crystallization of the cell after the point A and a decrease of the inclination angle of the temperature rise; completion of crystallization at the point B; subsequent temperature rise by the small inclination angle RcIa$^2$ up to the point C at the melting point; melting from the point C toward the point D; the temperature rise by a large inclination angle approximate to RaIa$^2$ after the point D and simultaneous quenching to Ta simultaneously with interruption of the pulse to quench the amorphous state at Ta, thereby to complete the recording.

In contrast, if c→a transition is intended by applying the same current pulse as that for a→a transition, since the temperature rises by the small inclination angle RcIa$^2$ from the point O at the environmental temperature to the point A at the crystallization temperature as shown in FIG. 14B, it takes more time than a→a transition. In the example shown in FIG. 14B, even if the a→a transition is intended, the cell is cooled at the point G before reaching the melting point by interruption of the pulse, and then reaches the point F. Thus it undesirably results in c→c transition.

To reliably bring about c→a transition, the powering time must be yet longer as shown by the dash-and-dot line in FIG. 14B, for example. However, such a long powering time extremely raises the temperature at the point E in the a→a transition (FIG. 14A) and may degrade the reliability due to thermal damage to the phase-change recording layer.

As explained above, compatibility of a→a transition and c→a transition is difficult in the constant-current drive mode.

Additional explanation is made below about reproduction. Reproduction in the constant-voltage drive mode is carried out by applying a reproduction voltage pulse Vr in the level insufficient for phase-change of the phase-change material and reading a signal current Vr/Ra in the amorphous state, signal current Vr/Rc in the crystal state, and signal current in the intermediate state. Reproduction in the constant-current drive mode is carried out by supplying a reproduction current pulse Ir in the level insufficient for phase-change of the phase-change material and reading the cell-end voltage RaIr in the amorphous state, cell-end voltage RcIr in the crystal state and voltage in the intermediate state.

Heretofore, in conjunction with FIGS. 12A through 15B, it has been explained that writing in PRAM in the overwrite mode is difficult when using an equal voltage pulse or current pulse.

Embodiments of the invention are based on cognition of this problem. These embodiments will now be explained below in detail with reference to some specific examples.

First Embodiment

As the first embodiment of the invention, an embodiment of PRAM is explained together with its drive circuit, which is configured to read the current state of a cell before writing in the cell, then compare the current state and the state after recording and apply an optimum write pulse.

This embodiment provides a phase-change nonvolatile storage device (PRAM) as a new phase-change nonvolatile solid memory element capable of completing all modes of transition without any inconsistency in both the constant-voltage drive mode and the constant-current drive mode. In this embodiment, two values of the amorphous state and the crystal state may be selected as record states, and the intermediate state containing mixture of amorphous portions and crystal portions may be additionally selected as a record state.

FIG. 1A is a schematic diagram illustrating a configuration of the substantial part of PRAM according to the embodiment of the invention. A plurality of Y address lines 12 and a plurality of X address lines 18 are connected to form a matrix of vertical and horizontal lines, and memory cells C are connected in respective cells to form an array. Each memory cell C may have the structure connecting a phase-change storage cell 1 and a cell selection diode 2 in series.

Once of memory cells C is selected by driver circuits 23A, 23B connected to Y address line 12 and X address lines 18, respectively, and its diode 2 is activated to write information in the storage cell 1 or read information therefrom. The driver circuits 23A, 23B may be provided either inside the storage device or outside as a separate device.

Connection of the storage cell 1 and the diode 2 in each memory cell C may be opposite. For selection of the storage cell 1, any of the forward property or the reverse property of the associated selection diode 2 may be used. For example, if the driver circuits 23A, 23B are activated to apply a forward bias of the diode 2 exclusively to the memory cell C to be selected and apply a reverse bias to the other memory cells C, then the forward current can be supplied only to the selected storage cell 1.

Figure 1B:
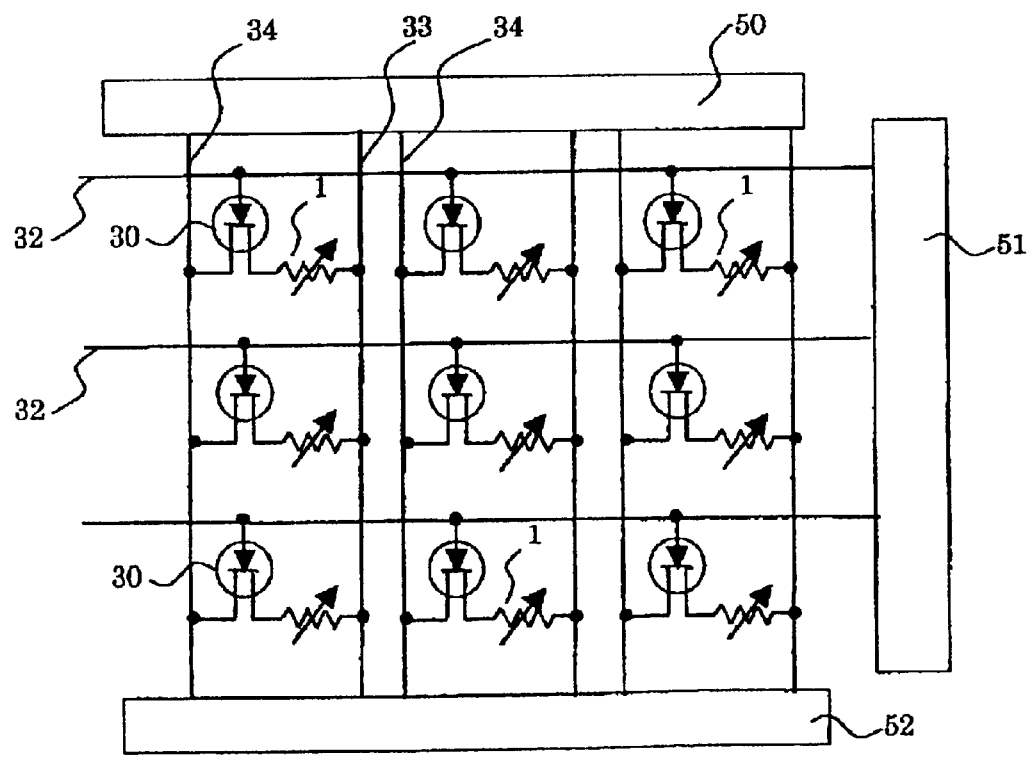

FIG. 1B is a schematic diagram illustrating another structure of PRAM according to the embodiment of the invention.

FIG. 1B shows a memory having an array of memory cells each made up of the phase-change storage cell 1 and a switching transistor 30. Here is shown a memory having an array of memory cells C each made up of a phase-change storage cell 1 and a switching transistor 30.

For the purpose of selecting one bit in the array, a column decoder 50 and a row decoder 51 are provided. One of switching transistors 30 is turned ON by a bit line 34 and a word line 32 to definitely select the particular memory cell, and a current can be supplied to the storage cell 1 from driver circuit 52.

Figure 2:
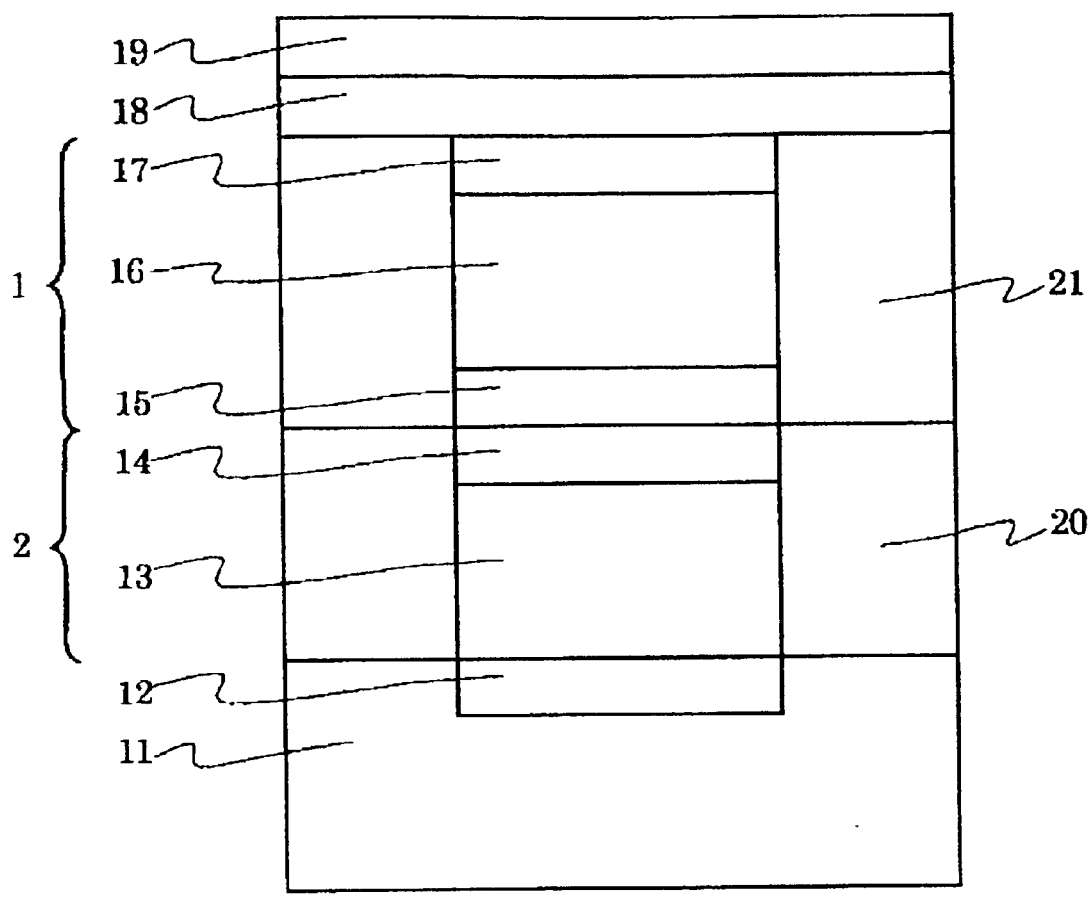
FIG. 2 is a schematic diagram illustrating a cross-sectional structure of a memory cell C of PRAM according to an embodiment of the invention.

FIG. 2 is a schematic diagram illustrating a cross-sectional structure of a memory cell C of PRAM according to the embodiment of the invention.

PRAM shown here has the structure stacking Y address lines 12, selection diodes 2, phase-change storage cells 1, X address lines 18 and protective layer 19 sequentially in the described order on a substrate 11. The illustrated stacking relation among respective components is not limitative, and the embodiment also contemplates a different stacking order of these components and addition of other appropriate components.

Each cell selection diode 2 has the structure stacking an n-type semiconductor layer 13 and a p-type semiconductor layer 14 on the Y address line 12. The diode 2 is electrically isolated from around it by a first insulation channel 20.

The phase-change storage cell 1 overlying the cell selection diode 2 has the structure sequentially stacking a first electrode 15, phase-change storage layer 16 and second electrode 17. The phase-change storage cell 1 is electrically isolated from around it by a second insulation channel 21.

Exemplary materials of the phase-change storage layer 16 are chalcogen compounds such as Ge—Sb—Te, In—Sb—Te, Ag—In—Sb—Te or Ge—Sn—Te, for example. These materials have large resistance ratios between amorphous states and crystal states, and they are desirable also for ensuring high-speed switching, repetitive recording stability and high reliability.

As the cell selection diode 2, a junction of ordinary semiconductors, typically a junction of n-type silicon (Si) and p-type silicon may be used. Selection of a cell can be effected by using a transistor such as MOSFET (metal-oxide-semiconductor field effect transistor) instead of a diode and forming an n-type or p-type channel (current path) between the source and the drain by application of the gate voltage.

The substrate 11 may be made of single-crystal silicon. By using an ordinary semiconductor process, diodes 2 and transistors can be formed thereon.

The Y address lines may be made of $n^+$ or $p^+$ high-concentrated semiconductor, or a metal such as aluminum (Al) or copper (Cu), for example. Its structure may be either single-layered or multiple-layered.

The electrodes 15, 17 of the phase-change storage cell 1 may have either a single-layered or multi-layered structure. It is preferable for ensuring repetitive recording, shelf life and reliability, for example, to form diffusion barriers of carbon (C) or amorphous silicon (a-Si) on and under the phase-change storage layer 16 and place a layer of a metal having a high melting point like tantalum (Ta), molybdenum (Mo) or tungsten (W), for example, on and under the diffusion barrier layers.

The X address lines are preferably made of a high-conductivity metal such as aluminum (Al) or copper (Cu).

The first insulation channel 20 if preferably made of a low-doped insulating semiconductor for convenience of the process, but other materials such as silicon oxide ($SiO_2$), silicon nitride ($Si_3N_4$), etc. are also acceptable. Exemplary materials of the second insulation channel 21 are silicon oxide ($SiO_2$), silicon nitride ($Si_3N_4$), aluminum oxide ($Al_2O_3$), tantalum oxide ($Ta_2O_3$), titanium oxide ($TiO_2$), zirconium oxide ($ZrO_2$), boron nitride (BN), plasma polymers of the carbon-hydrogen (C—H) system or carbon-fluorine (C—F) system, spin coat polyimide, and the like.

The protective layer 19 may be made of a material selected from those usable as the second insulation channel.

Heretofore, configuration of the substantial part of PRAM according to the embodiment of the invention has been explained.

Next explained are operations and functions of PRAM according to the embodiment.

PRAM according to the embodiment selects a predetermined phase-change storage cell 1 via the associated selection diode of the memory cell C to read or write data by driving the driver circuits 23A, 23B.

Read operation of PRAM according to the embodiment is first explained briefly. To read the current state of the phase-change storage cell 1, a reproduction voltage pulse Vr in a level insufficient for phase change is applied to the phase change material, and a signal current Vr/Ra in the amorphous state, signal current Vr/Rc in the crystal state, and signal currents in intermediate states between Vr/Ra and Vr/Rc are red out.

Therefore, the difference between Ra and Rc is preferably as large as possible for increasing the reproduction signal amplitude and for setting as many intermediate states as possible. In phase-change memory devices, differences between Ra and Rc are originally large even beyond a sufficient level because of the properties of materials used. Therefore, also when the embodiment of the invention is applied, a sufficiently large reproduction signal amplitude can be obtained, and many-value recording is possible.

Next explained is write operation of PRAM according to the embodiment.

FIGS. 3A through 3D are graph diagrams showing a method of recording in a selected memory cell 1 in the constant-voltage drive mode. More specifically, FIGS. 3A through 3D show aspects of a→a transition, c→a transition, a→c transition and c→c transition, respectively. For example, the expression "a→a transition" is used to mean that the storage cell is in the amorphous state before writing and intended to keep the amorphous state even after writing.

As shown in FIGS. 3A through 3D, the embodiment applies a reproduction pulse Vr beforehand in any cases, and after reading the cell state before writing, applies a predetermined writing pulse (even a zero pulse as well), taking the state into account.

Figure 3A:
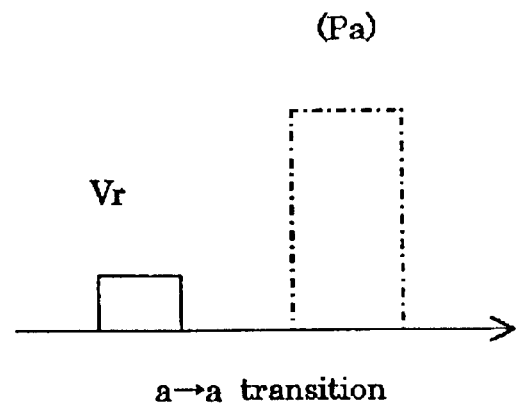
FIGS. 3A through 3D are graph diagrams showing a method of recording in a selected memory cell 1 in a constant-voltage drive mode.

More specifically, in case writing of a certain cell into the amorphous state is intended, as shown in FIG. 3A, the current cell state is first read by applying the reproduction pulse Vr. If the cell is found to be in the amorphous state, the cell does not need application of any writing pulse. In this case, no writing pulse is applied, or a writing pulse Pa for a→a transition as shown in FIG. 12A may be applied.

Figure 3B:
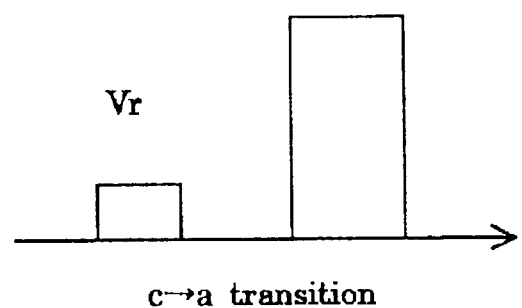

If the cell is in the crystal phase before writing and should be changed into the amorphous state as shown in FIG. 3B, the pulse Pa as shown in FIG. 12B may be applied.

Figure 3C:
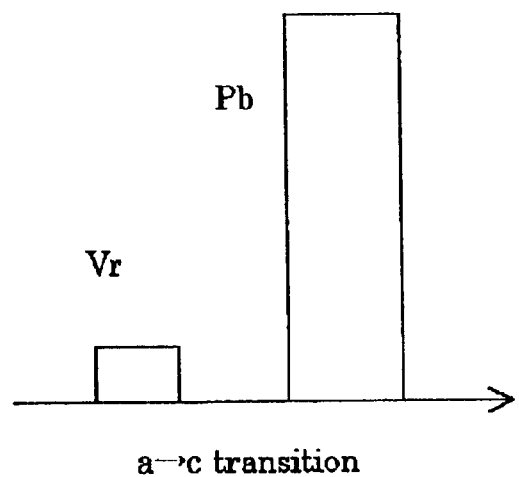
Figure 3D:
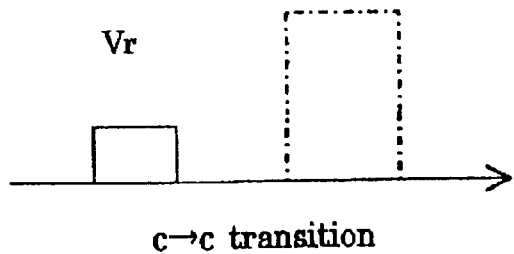

If the cell is in the amorphous state before writing and should be changed to the crystal state as shown in FIG. 3C, a pulse Pb for a→c transition as shown in FIG. 13A may be applied.

If the cell is in the crystal state before writing and should be maintained in the crystal state, any writing pulse need not be applied, or a pulse Pc causing c→c transition as shown in FIG. 13B may be applied.

As explained above, the series of processings to apply the reproduction pulse Vr, thereby read the cell state, and apply an optimum writing pulse (including the zero pulse) in accordance with the state can be executed by the drivers 23A, 23B shown in FIG. 1A. The drivers, namely, driver circuits, may be built in PRAM together with the memory cells, or may be connected as external circuits.

Table 3 shows relations between cell transition modes and associated writing pulses under the constant-voltage drive mode according to the embodiment.

TABLE 3

| transition | writing pulse |
|---|---|
| a → a | 0 (or P a) |
| c → a | P a |
| a → c | P b |
| c → c | 0 (or P c) |

As shown in Table 3, if the cell states before and after writing are equal, any recording pulse need not be applied. Basically, therefore, a corresponding recording pulse may be applied merely for only two modes of transition, c→a and a→c.

In case of c→a transition under the constant-drive mode, energy of the recording pulse may be lower than that shown in FIG. 3B. That is, in FIG. 3B, if a cell is in a state already passing the point H, its amorphous state can be obtained by interrupting the pulse and quenching it. Therefore, the recording pulse voltage Va may be low or the pulse width may be short, and quick and low-consumption writing is possible. In contrast, in a→c transition, since the temperature rising speed in the constant-voltage drive mode is relatively slow, it is necessary to raise Vc or elongate the pulse width.

Next explained are write operations in the constant-current drive mode according to the embodiment.

FIGS. 4A through 4D are graph diagrams showing a method of recording in a selected memory cell in a constant-current drive mode, and show aspects of a→a transition, c→a transition, a→c transition and c→c transition, respectively.

Also in the constant-current drive mode, a reproduction pulse Ir is applied beforehand. Then, the cell state before writing is read, and a predetermined writing pulse (possibly, zero pulse as well) is applied in accordance with the state.

Figure 4A:
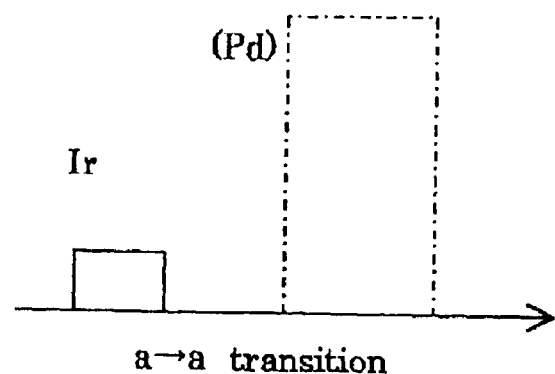
FIGS. 4A through 4D are graph diagrams showing a method of recording in a selected memory cell in a constant-current drive mode.

More specifically, as shown in FIG. 4A, in order to maintain a cell taking the amorphous state before writing in the amorphous state, the cell does not need application of any writing pulse. In this case, no writing pulse is applied, or a writing pulse Pd for a→a transition as shown in FIG. 14A may be applied.

Figure 4B:
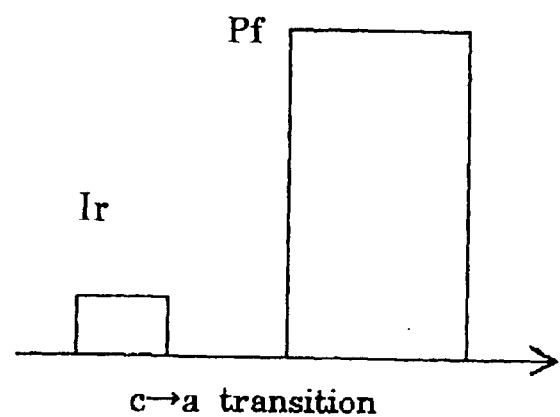

In the case shown in FIG. 4B where the cell is in the crystal phase before writing and should be changed into the amorphous state, a pulse Pf as shown in FIG. 14B may be applied.

Figure 4C:
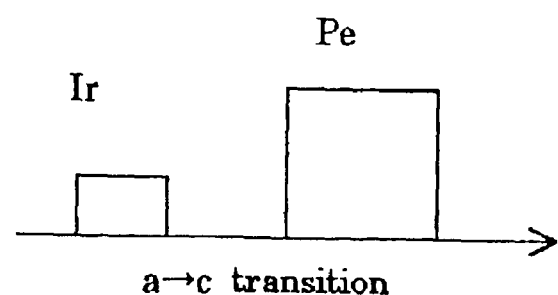

On the other hand, in the case shown in FIG. 4C where the cell is in the amorphous state before writing and should be changed to the crystal state, a pulse Pe for a→c transition as shown in FIG. 15A may be applied.

Figure 4D:
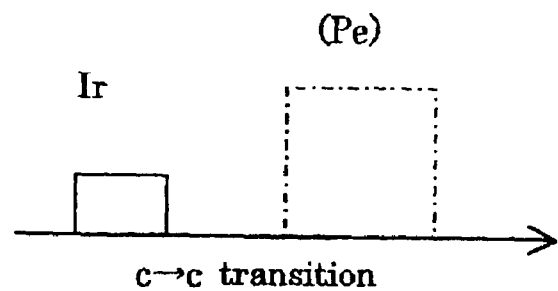

In the case shown in FIG. 4D where the cell is in the crystal state before writing and should be maintained in the crystal state, any writing pulse need not be applied, or a pulse Pe causing c→c transition as shown in FIG. 15B may be applied.

Table 4 shows relations between cell transition modes and associated writing pulses under the constant-current drive mode according to the embodiment.

TABLE 4

| transition | writing pulse |
|---|---|
| a → a | 0 (or P d) |
| c → a | P f |
| a → c | P e |
| c → c | 0 (or P e) |

As shown in Table 4, also in the constant-current drive mode, if the cell states before and after writing are equal, any recording pulse need not be applied. Basically, therefore, a corresponding recording pulse may be applied merely for only two modes of transition, c→a and a→c.

In the constant-current drive mode, the temperature rising speed is slow during c→a transition as shown in FIG. 14B, but high during a→c transition as shown in FIG. 15A.

Therefore, for quick and low power-consuming operations, it is preferable to provide both a constant-voltage source and a constant-current source in the driver circuits 23A, 23B so as to selectively use these two sources for respective transitions. Thus it is efficient to use the constant-voltage drive mode for c→a transition and the constant-current drive mode for a→c transition.

In the specific example shown above, two-value recording between the amorphous state and the crystal state was shown. However, the above-made discussion holds also when the cells are replaced by cells containing high-resistance amorphous states as their major components and cells containing crystal states as their major component.

Regarding a→a transition and c→a transition in the embodiment, the following processes are usable in lieu of the above example to bring about those transitions.

That is, in FIG. 12B, c→a transition is finished at the point H. also when the cell is quenched from the point H, c→a transition can be realized similarly to the case quenching the cell from the point I.

Further, if the pulse is interrupted in intermediate points of the path GH as explained above, many-value recording is possible. During the corresponding a→a transition, interruption of the pulse occurs before arrival at the point A in FIG. 12A. Therefore, the cell in the amorphous state before recording does not undergo phase change in the recording process and maintains the amorphous state. Thus the a→a transition is completed. This method is advantageous in requiring a shorter recording time and a lower power consumption than those required in the above-explained method that once crystallizes the cell in the process of a→a transition.

Below explained are some examples of PRAM according to the first embodiment.

The Inventor experimentally prepared the structures shown in FIGS. 1A through 2 as examples of PRAM acceding to the embodiment of the invention. Their configurations and materials were already explained. Here is made an additional explanation about the thickness and the size of the phase-change storage layer.

For example, in case the phase-change storage layer has the size of 0.2 $\mu$m×0.2 $\mu$m on an XY plane, if its thickness is 100 nm, amorphous cells can be supplied with the current of 1 $\mu$A and crystalline cells can be supplied with the current of 100 $\mu$A under the drive voltage of 2.5 V. Although this is an example, thickness of the phase-change storage layer can be optimized in accordance with the cell size (area) and required values of voltage and current of the driver circuits as already explained.

In general, when the cross-sectional area of the electrically conductive portion of the cell is S, thickness of the phase-change storage layer is d, specific resistance of the amorphous state is ρa, and specific resistance of the crystal state is ρc, the resistance Ra of the cell in the amorphous state and the resistance Rc of the cell in the crystal state can be expressed by the following equations.

$$Ra=\rho ax(d/S)$$

$$Rc=\rho cx(d/S)$$

Therefore, in the constant-voltage drive mode, when assigning Va to the amorphism-forming voltage, Vc to the crystallizing voltage, and Vr to the reproducing voltage, d, Va, Vc and Vr may be adjusted to obtain a suitable amorphism-forming power, crystallizing power, amorphism-reproducing current and crystal-reproducing current from relations between Ra, Rc and Va, Vc, Vr.

In the constant-current drive mode, amorphism-forming current Ia, crystallizing current Ic and reproducing current Ir may be adjusted in lieu of Va, Vc and Vr.

A method of forming the element shown in FIGS. 1A through 2 and a result of operation according to the embodiment of the invention will be explained below.

PRAM according to the embodiment shown in FIGS. 1A through 2 can be made by adding a process of forming and processing a film of a phase-change material to an ordinary semiconductor manufacturing process. For example, it may be made through the following procedures.

For example, using a technique used in a typical semiconductor process such as ion implantation or diffusion method, an n$^+$ conductive region is formed on a p-type single-crystal silicon (Si) substrate 11 and it is processed into Y address lines 12. The Y address lines 12 are formed to extend vertically to the drawing sheet plane of FIG. 2 in a line-and-space arrangement.

An n-type doped layer is epitaxially grown on the n$^+$ conductive region to form an n-type semiconductor layer 13. In the process of forming the n-type semiconductor layer 13, the portion for the first insulating channel 20 is masked. Thickness of the n-type semiconductor layer 13 is 500 nm, for example.

After that, the first insulating channel 20 of a p-type doped semiconductor is formed to surround the n-type semiconductor layer 13. The first insulating channel 20 is grid-shaped on the wafer substrate 11 to appear as if the n-type semiconductor is buried in each square space of the grid. The first insulating channel 20 may be a p-type doped layer or an insulating film of $SiO_2$ for example deposited by CVD (chemical vapor deposition).

Subsequently, $SsiO_2$, for example, is deposited at least as a part of the second insulating channel 21 on the first insulating channel 20 and the n-type semiconductor layer 13 by thermal oxidation or CVD, and the first insulating channel 20 is removed from above the n-type semiconductor layer 13 by etching. Onto the n-type semiconductor layer thus exposed, a p-type material is diffused to form a p-type semiconductor layer 14. Thus the diodes 2 made up of the n-type semiconductor layer 13 and the p-type semiconductor layer 14 are formed.

Thereafter, phase-change storage cells 1 each comprised of the first electrode 15, phase-change storage layer 16 and second electrode 17 are formed on the p-type semiconductor layer 14 by sputtering or vapor deposition, for example. As this part of the process, some specific methods are usable.

One of them is the process that forms the second insulating channel 21 beforehand, selectively removes it from portions for the p-type semiconductor layer to reserve portions for phase-change storage cells in form of holes, thereafter deposits a phase-change storage cell material by anisotropic sputtering or vapor deposition, for example, and next removes the phase-change storage cell material from above the second insulating channel by CMP (chemical mechanical polishing), for example.

Another method is the process that first forms phase-change storage cells as a continuous film, then isolates discrete storage cells by RIE (reactive ion etching), for example, thereafter buries the second insulating channel in form of a grid by CVD or anisotropic sputtering, for example, and removes the second insulating channel material from above the phase-change storage cell by CMP, for example.

There are yet other processes usable for the same purpose.

The first electrode 15 and the second electrode 17 may be single-layered, respectively. However, it is desirable to place carbon (C) films, for example, as diffusion barriers on and under the phase-change storage layer 16 and additionally place layers of a metal having a high melting point such as tantalum (Ta), molybdenum (Mo) or tungsten (W) as main electrodes on and under the diffusion barriers. The carbon (C) barrier layer may be 10–50 nm thick, main electrodes 15, 17 may be 100–200 nm thick, and the phase-change storage layer 16 may be determined for respective cell sizes to match the required values of voltage and current of the driver circuits.

After that, X address lines 18 are formed on the second electrode 17 and the second insulating channels 21 of the phase-change storage cells 1. For example, a thin film of aluminum (Al), copper (Cu), or the like, having a high conductivity is first formed as a continuous film by sputtering or vapor deposition, and the thin film is thereafter selectively etched into lines connecting the second electrodes to obtain the X address lines 18.

Finally, the protective layer 19 is formed to protect the elements from humidity and others. As the protective layer 19, $Si_3N_4$ formed by CVD or sputtering or polyimide spin-coated and cured by baking, for example, is preferably used.

In addition to the examples shown above, other various modifications are usable for forming PRAM according to the embodiment of the invention, by appropriately combining PEP (photo-engraving process); film-forming process such as thermal CVD, plasma CVD, MOCVD (metal organic CVD), epitaxial growth, sputtering, vapor deposition, plasma polymerization, spin-coating, etc.; doping process such as implantation, thermal diffusion, etc.; etching process such as RIE (reactive ion etching), CDE (chemical dry etching), ion milling, wet etching, etc.; and surface-smoothing process such as CMP or ion polishing, etc.

Next explained is a result of operating PRAM by the driver circuits as shown in FIGS. 1A and 1B.

Figure 5:
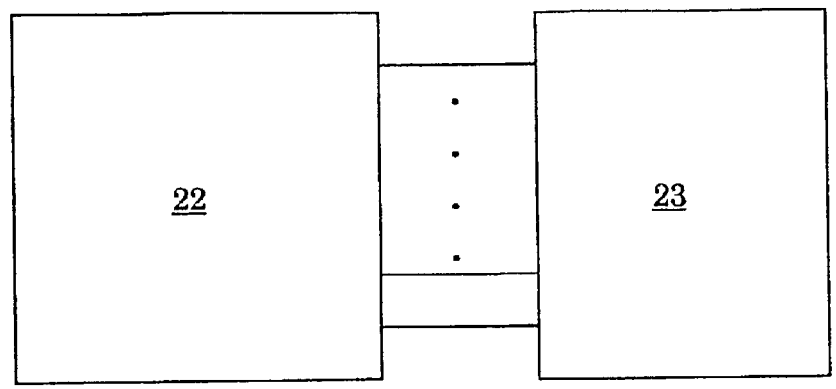
FIG. 5 is a schematic diagram showing a mode of connection between a memory cell portion 22 of PRAM and a driver 23.

FIG. 5 is a schematic diagram showing a mode of connection between a memory cell portion 22 of PRAM and the driver 23. The driver circuit 23 (23A, 23B) is basically comprised of a power source, switching element and signal detector circuit. The memory cell portion 22 and the driver circuit 23 may be formed as a hybrid arrangement on a common substrate, or may be formed on separate substrates and connected after chipping.

Wirings of the memory cell portion 22 and the driver circuit 23 are basically X address lines 18 and Y address lines 12. Recording and reproduction is carried out by applying a predetermined voltage between the X address lines and Y address lines or by supplying a predetermined current there. If a forward bias is applied to opposite ends of a cell to be selected and all of the other cells are reversely biased by using the switching element of the driver circuit 23, the cell can be selected.

In case that MOSFET (metal-oxide-semiconductor field effect transistor) is used for selection of a cell, by connecting the Y address line to the source, connecting the X address line to the drain in serial connection to the phase-change storage cell, connecting the word line to the gate, and applying the gate voltage via the word line, the predetermined cell can be selected. Whichever of a diode or a transistor is used for selection of a cell, the same method as DRAM, FeRAM, MRAM, etc. can be used for selecting operation.

In PRAM capable of selecting a predetermined cell and thereby reading or writing data of the cell in the above-explained manner, by reading the cell state and applying an optimum writing pulse, if necessary, in accordance with the state as explained with reference to FIGS. 3A through 4D, predetermined data can be written reliably and easily. Additionally, by omitting useless writing pulses, PRAM quick in writing and low in power consumption can be realized.

Second Embodiment

Next explained is the second embodiment directed to PRAM capable of many-value recording. Although the first embodiment is application of the invention mainly to two-value recording using the amorphous state and the crystal state, the invention is similarly applicable also to many-value recording.

Figure 6A:
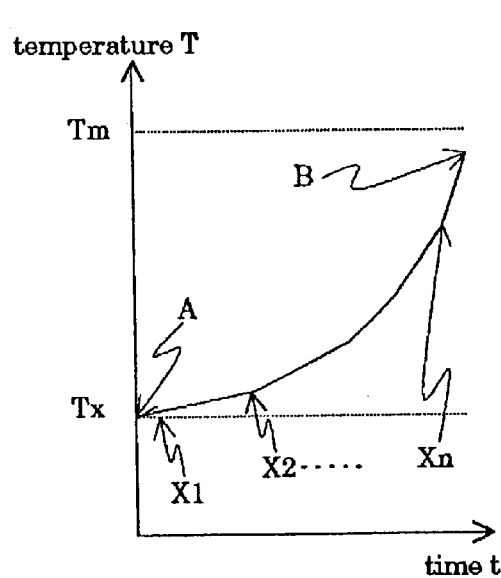
FIG. 6A is a graph diagram showing the AB portion of FIG. 12A or JK portion of FIG. 13A in an enlarged scale.
Figure 6B:
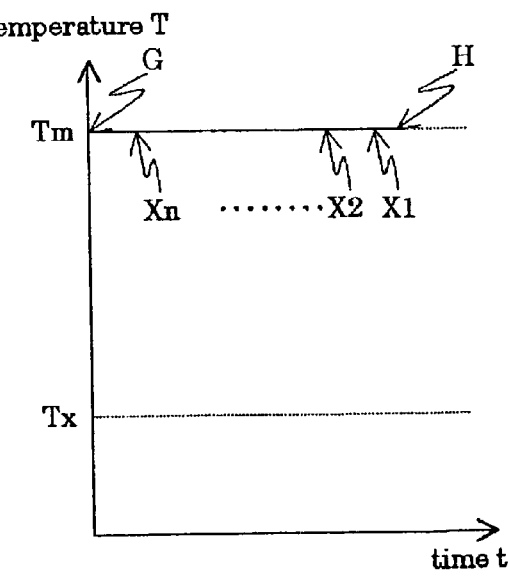
FIG. 6B is a graph diagram showing the GH portion of FIG. 12B or MN portion of FIG. 13A in an enlarged scale.

FIG. 6A is a graph diagram showing the AB portion of FIG. 12A or JK portion of FIG. 13A in an enlarged scale. FIG. 6B is a graph diagram showing the GH portion of FIG. 12B or MN portion of FIG. 13A in an enlarged scale.

In FIG. 6A, the point A indicates the amorphous state, and point B indicates the crystal state. Points between the points A and B correspond to intermediate states X1, X2, . . . Xn. The states X1 through Xn can be controlled by adjusting the applied voltage and the powering time.

In the intermediate states X1 through Xn, the storage cell is between the point A and the point B. One of them is the state where the amorphous matrix surrounds minute crystal grains, and the size or density of crystal grains is increasing from the state X1 toward the state Xn. Another is the state where crystal pillars or cylindrical crystal cylinders are formed to substantially communicate upper and lower portions of the cell, and amorphous cylinders surround the crystal pillars, or amorphous pillars exist in crystal cylinders, and the cross-sectional area of the crystal pillars or crystal cylinders along the XY plane is increasing from X1 toward Xn.

On the other hand, the point G in FIG. 6B is the amorphous state, and the point H is the crystal state. Points between the points G and H correspond to intermediate states Xn, . . . X2, X1. Any states from Xn to X1 can be realized by adjusting the applying voltage of the pulse to be applied to the cell and the powering time.

For carrying out many-value recording using the embodiment of the invention, as already explained in conjunction with the first embodiment, by knowing the cell state by previously supplying a reproducing pulse before recording, and comparing that state with the state after recording, it is possible to select the power source and the recording pulse capable of recording most quickly with the lowest power consumption and the recording pulse. Recording of an intermediate state may be realized between the point A and the point B in FIG. 6A, or between the point G and the point H in FIG. 6B. Alternatively, both these both processes may be combined.

Figure 7:
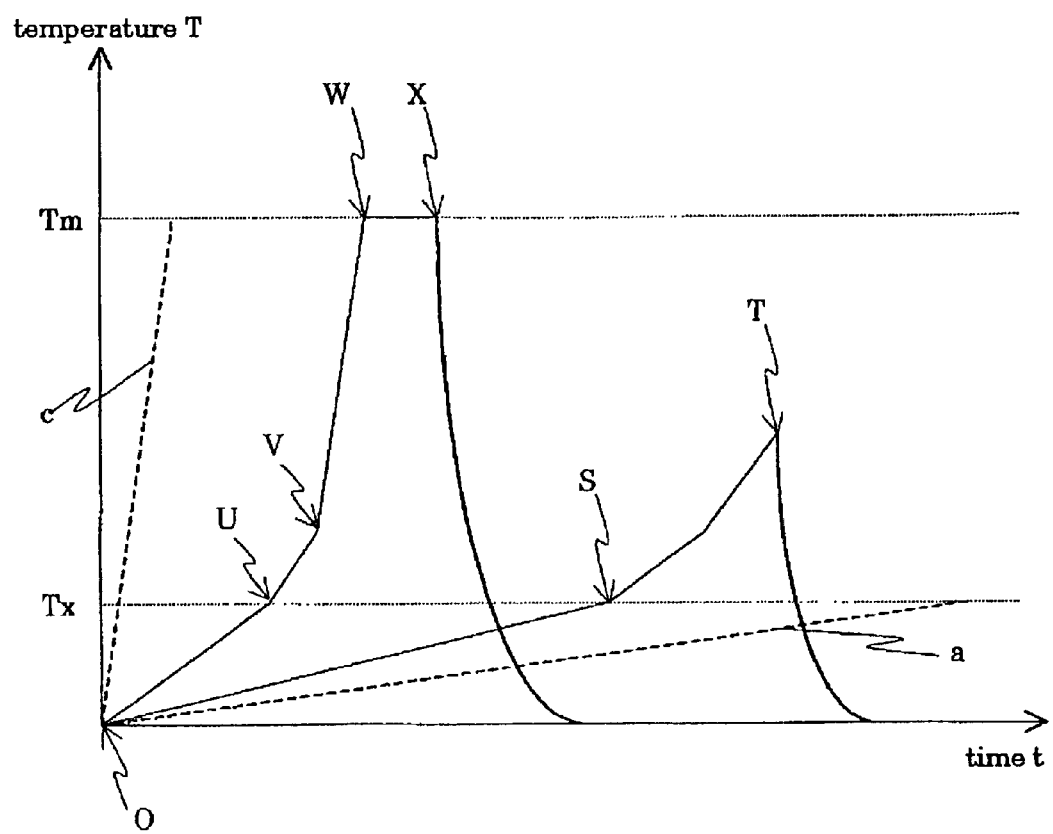
FIG. 7 is a graph diagram for explaining a recording process in case of changing a cell from a certain intermediate state to a different intermediate state.

FIG. 7 is a graph diagram for explaining a recording process in case of transiting a cell from a certain intermediate state to a different intermediate state. Broken lines denoted by a and c in FIG. 7 are lines showing changes of the cell temperature after heating a cell in a substantially complete amorphous state and a cell in a substantially complete crystal state in the constant-voltage drive mode. As already explained, in the constant-current drive mode, positional relation of the broken lines a and c in FIG. 7 is opposite.

In FIG. 7, two different kinds of temperature hysteresis during recording of two different intermediate states are shown. The temperature hysteresis traces the path OS for one state, and traces the path OU for the other state.

The process tracing the path OS corresponds to an intermediate state containing amorphous portions by a higher ratio (amorphous level) whereas the process tracing the path OU corresponds to an intermediate state containing crystal portions by a higher ratio (crystallization level).

Here is first explained the recording process for changing the intermediate state passing the path OS to a different intermediate state.

Although not shown, for changing the state passing the path OS to amorphous state, the process may follow the a→a transition shown in FIG. 12A. In this case, if the pulse is interrupted in a mid course of the path CD in the a→a transition of FIG. 12A, recording to a state in a higher amorphous level than the state of the path OS can be carried out.

Next explained is the method for recording a state in a higher crystallization level than the state of the path OS. In this case, powering is continued from the point s toward the point T. If substantial crystallization occurs at the point T, by interrupting the pulse in a mid point of the path ST, recording for changing to an intermediate state in a higher crystallization level than the state of path OS can be accomplished.

Next explained is the process for recording the intermediate state passing the path OU to a different intermediate state.

The process of interrupting the pulse between the point U and the point V can be used for recording of a state in a higher crystallization level than that of the path OU. If the cell is substantially crystallized at the point V, by interrupting the pulse at the point, the cell can be changed to a crystallized cell.

On the other hand, for changing the cell to a state in a higher amorphous level than that of the path OU, the pulse may be interrupted in a mid point of the path WX after raising the temperature to the point W. If the cell material melts substantially completely at the point X, by interrupting the pulse at the point X or thereafter, the cell can be changed to the amorphous state.

Also in the constant-current drive mode, many-value recording is possible similarly to the recording in the constant-voltage mode excepting the reversal of the temperature rising ratios of lines a and c, by reference to FIGS. 14A to 15B.

Similarly to the two-value recording, also upon many-value recording, the constant-current drive mode is more preferable to change a cell from a high amorphous level to a high crystallization level, the constant-voltage drive mode is more preferable to oppositely change a cell from a high crystallization level to a high amorphous level.

Third Embodiment

Next explained is the third embodiment directed to PRAM adjusted in trailing edge of the writing pulse in accordance with the post-writing state and a driving circuit thereof.

In this embodiment, upon changing a storage cell of PRAM to the amorphous state, the trailing edge of the recording pulse is adjusted such that the hold time at the crystallization temperature for the cell to cool down is shorter than the crystallization start time of the phase-change material. Upon crystallizing the storage cell, the trailing edge of the recording pulse is adjusted such that the hold time in the crystallization temperature range upon cooling the cell is longer than the crystallization-completing time of the phase-change material.

In this manner, it is possible to overcome the basic problem of conventional PRAM, namely, the problem that a→c transition and c→c transition are incompatible in the overwrite mode.

Also in this embodiment, as shown in FIGS. 1A and 1B or FIG. 5, storage cells C containing a phase-change material are arranged in an array, and the driver circuit 23 (23A, 23B) is connected to respective storage cells C to enable reading and writing. The driver circuit 23 may be integral with the storage cells, or may be an external circuit.

With this configuration, the process of overwrite recording between the amorphous state and the crystal state according to the embodiment will be explained.

Figure 8A:
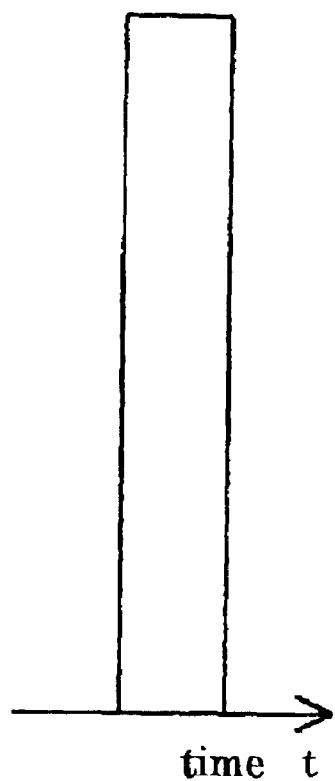
FIGS. 8A through 8F are graph diagrams showing waveforms of recording pulses used for recording in a selected cell in the constant-current drive mode.
Figure 8B:
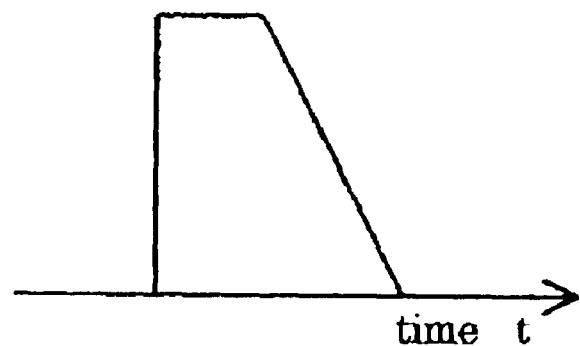
Figure 8C:
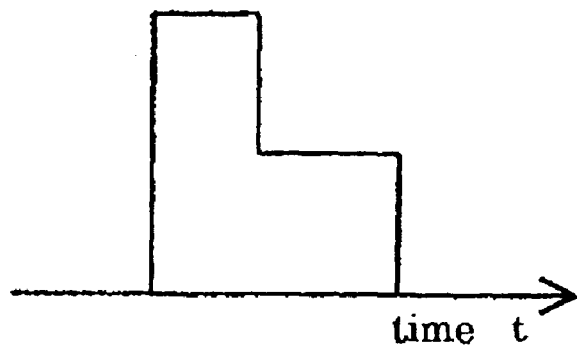
Figure 8D:
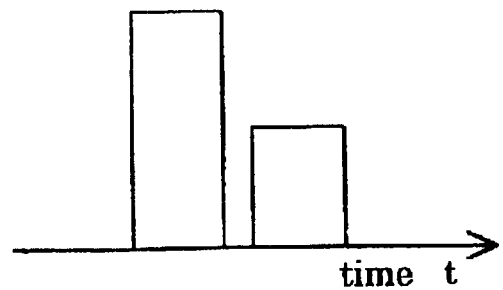
Figure 8E:
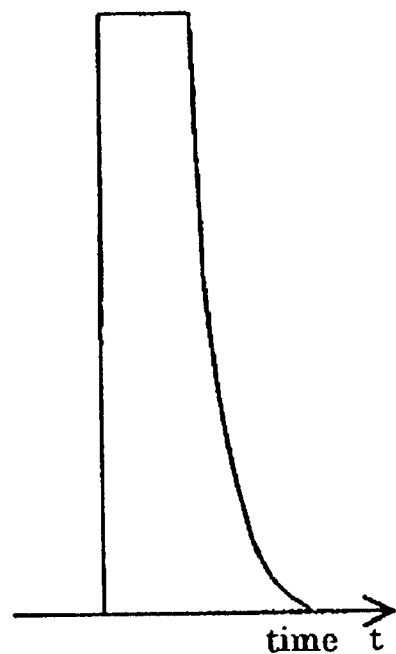

FIGS. 8A through 8F are graph diagrams showing waveforms of recording pulses used for recording in a selected cell in the constant-current drive mode. FIG. 8A shows a writing pulse for transition of a cell to the amorphous state, and FIGS. 8B through 8D show writing pulses for transition of a cell to the crystal state. In these graphs, the abscissa indicates the time, and the ordinate indicates the voltage.

The time of the trailing edge of the amorphism-forming pulse shown in FIG. 8A is very short. In contrast, the crystallizing pulses are characterized in having a long time of the trailing edge (FIG. 8B), holding an intermediate level for an adequate time in the trailing edge (FIG. 8C), or adding an intermediate pulse within a very short time after once raising the pulse (FIG. 8D).

In this embodiment, it is the conditions required upon changing a storage cell to the amorphous state that the recording pulse is adjusted to have a shorter trailing time in the crystallization hold time upon cooling the cell than in the crystallization start time of the phase-change material.

Therefore, within the range satisfying these conditions, the recording pulse can be modified in waveform in various modes shown or not shown in FIGS. 8A through 8D. For example, the writing pulse for changing the cell to the amorphous state may have the waveform shown in FIG. 8E having a trailing edge of a short time. That is, it is sufficient that the time of the trailing edge is shorter in the crystallization hold time upon cooling the cell than in the crystallization start time of the phase-change material.

Figure 8F:
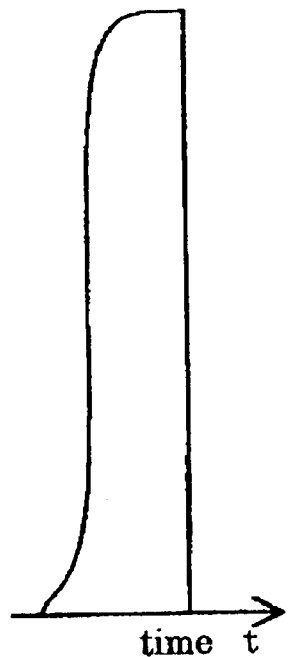

As to the rising edge of the pulse, a certain extent of rising time may be provided as shown in FIG. 8F for both the amorphism-forming pulse and the crystallizing pulse.

Explained below are operations and effects of overwrite recording using the pulses shown in FIGS. 8A and 8B.

Temperature hysteresis of the storage cell in case of using the recording pulse shown in FIG. 8A is as a→a transition and c→a transition already explained in conjunction with FIGS. 12A and 12B. that is, regardless of the amorphous state or the crystal state of the pre-recording cell, the cell is maintained in or changed to the amorphous state by the same recording pulse. Therefore, overwrite recording is possible.

In contrast, as shown in FIGS. 8B through 8D, recording pulses used in this embodiment for crystallization have unique trailing edges.

Figure 9A:
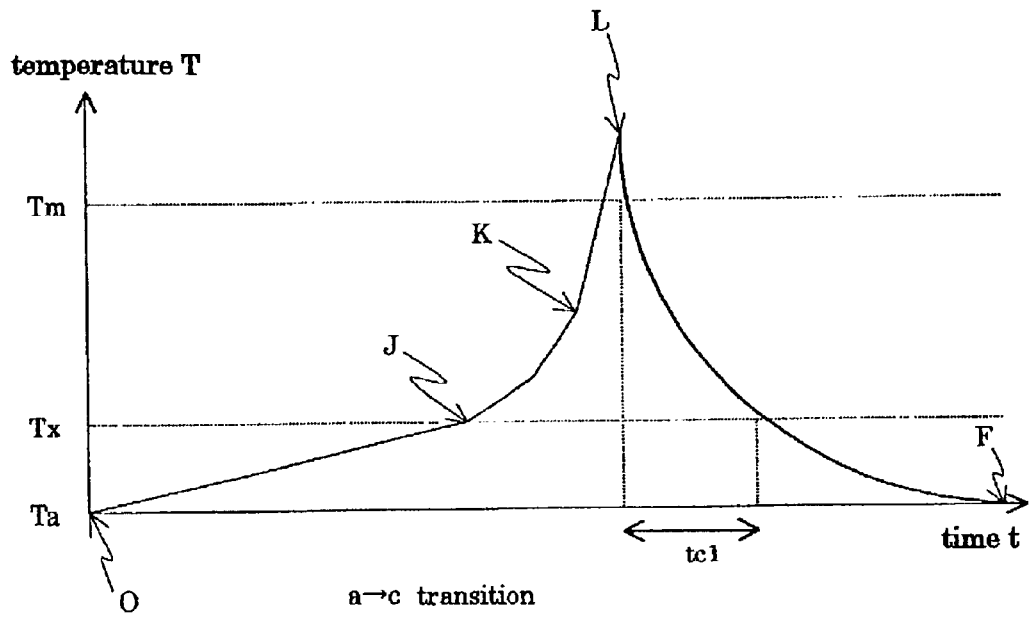
FIGS. 9A and 9B are graph diagrams showing a temperature hysteresis of a cell in case of using the crystallization pulse shown in FIG. 8B.
Figure 9B:
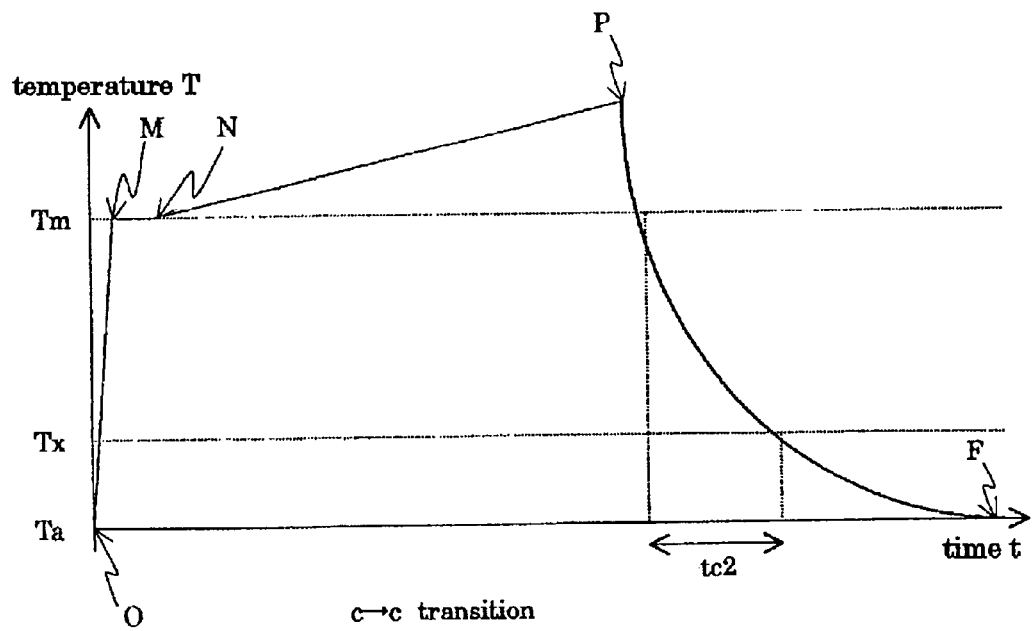

FIGS. 9A and 9B are graph diagrams showing a temperature hysteresis of a cell in case of using the crystallization pulse shown in FIG. 8B. FIG. 9A is the graph of a→a transition and FIG. 9B is the graph of c→c transition.

The hysteresis shown in FIGS. 9A and 9B correspond to the graph diagrams of a→c transition and c→c transition shown in FIGS. 13A and 13B, but have longer time axes. Therefore, phase-change points and pulse-interrupting points in the temperature hysteresis of FIGS. 9A and 9B correspond to those of FIGS. 13A and 13B.

The point L in a→c transition shown in FIG. 13A does not reach Tm because, if not, the cell undesirably changes to the amorphous state in the modes of FIGS. 13A and 13B. In contrast, in FIG. 9A, the point L is beyond Tm. In this embodiment, only if the temperature is higher at the point L than at the point K (crystallization-completing point), it is immaterial whether the point L is lower than Tm or it is equal to or higher than Tm. As such, the instant embodiment has a higher freedom than the version shown in FIG. 13A, and can set a wider margin for the height or pulse width of the crystallizing pulse.

A feature of the instant embodiment lies in the cooling process by the recording pulse. In FIGS. 13A and 13B, the trailing edge of the crystallizing pulse is not adjusted intentionally. Therefore, since the pulse level rapidly drops to the zero level, the storage cell is quenched after interruption of the pulse. In contrast, the instant embodiment adjusts the trailing of the crystallizing pulse and the level gently drops to the zero level. Therefore, the cell cools down slowly.

In the cell cooling process starting from the point L in the a→c transition shown in FIG. 9A, the duration of time where the temperature is held in the crystallizing temperature range lower than Tm and not lower than Tx is indicated by tc1. Similarly, in the cell cooling process starting from the point P in c→c transition shown in FIG. 9B, the duration of time where the temperature is held in the temperature range lower than Tm and not lower than Tx is indicated by tc2. In this case, although tc1 and tc2 are different when the temperature is different between the point L and the point P, the difference is very small, and they are approximately equal when the temperature is equal at both points L and P.

When assigning τxs to the crystallization start time of the phase change layer forming the storage cell, τxe to the crystallization-completing time, and ta to the duration of time where the cell is held in the temperature range lower than Tm and not lower than Tx after interruption of the amorphism-forming pulse of FIG. 8A, the instant embodiment carries out overwriting to satisfy the following conditions.

$$ta < \tau xs < \tau xe \leq tc1$$

$$ta < \tau xs < \tau xe \leq tc2$$

That is, in case of changing the storage cell to the amorphous state, the trailing edge of the recording pulse is adjusted such that the crystallization hold time ta for the cell to cool down is shorter than the crystallization start time τxs. On the other hand, in case of crystallizing the storage cell, the trailing edge of the recording pulse is adjusted such that the crystallization hold time tc1 or tc2 for the cell to cool down is equal to or higher than the crystallization-completing time τxe of the phase-change material.

In this manner, regardless of the amorphous state or the crystal state of the pre-recording cell, the cell can be maintained in or changed to the amorphous state or crystal state by using a definite amorphism-forming pulse and a definite crystallizing pulse. That is, overwriting can be realized by using two different recording pulses.

The above-mentioned τxs and τxe are material parameters of the phase-change recording layer used in the cell, and they are in the range from several nanoseconds to tens of nanosecond, although variable depending upon the material composition. In case of a nucleation-dominant phase-change material such as GeSb having the composition near the tie line between two metal compound compositions GeTe and $Sb_2Te_3$ on the phase diagram, the crystallization start time τxs is the time where the phase-change material is held in a temperature range not lower than Tx and lower than Tm and generation of crystal nuclei begins.

In case of a crystal-growth-dominant phase-change material such as GeSbTe, InSbTe or AgInSbTe, for example, containing a material close to the $Sb_{70}Te_{30}$ eutectic composition as its major component and additionally containing germanium (Ge), indium (In) or silver (Ag), for example, the crystallization start time τxs is the time where the phase-change material is held in a temperature range not lower than Tx and lower than Tm and crystal growth begins from minute crystal nuclei.

On the other hand, the crystallization-completing time τxe is the time required for progressing generation of crystal nuclei until crystal nuclei coalesce and fill the cell with crystal grains, or for progressing crystal growth until the cell crystallizes entirely.

In case of crystallizing the storage cell, if the trailing edge of the recording pulse is adjusted such that the crystallization hold time tc1 or tc2 for the cell to cool down is not shorter than the crystallization-completing time τxe of the phase-change material, then the crystal cell can be formed by re-crystallization in he cooling process, even after once melting the cell in a mid point of the crystallizing process as the point L or P of FIGS. 9A and 9B.

The instant embodiment is applicable in both the constant-voltage drive mode and the constant-current drive mode. However, it is more advantageously applicable to the constant-voltage drive mode for which the conventional technique involved experienced a difficulty regarding compatibility of a→c transition and c→c transition, i.e. the problem regarding crystallization recording.

Fourth Embodiment

Next explained is the fourth embodiment directed to PRAM employing the third embodiment and capable of many-value recording.

Figure 10A:
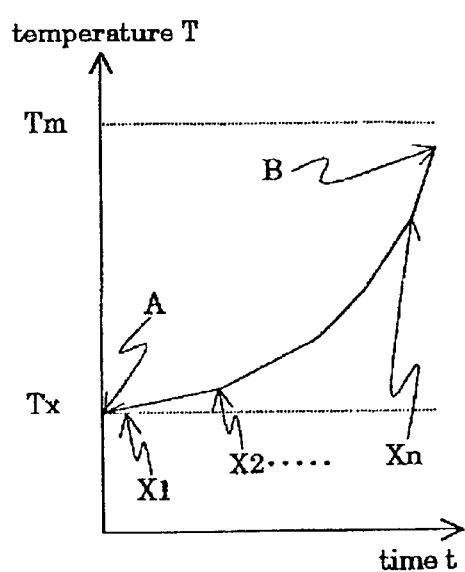
Figure 10B:
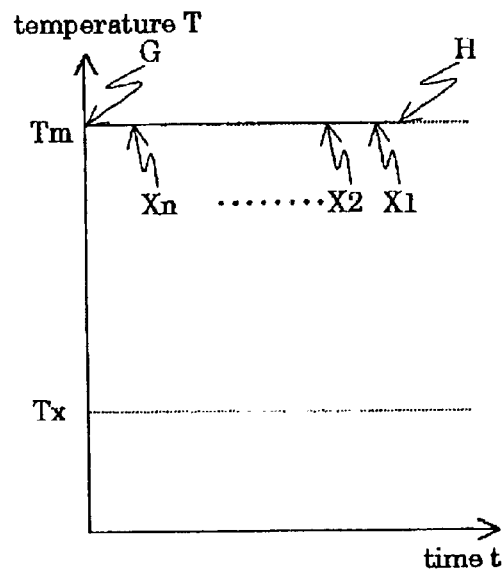

FIGS. 10A and 10B are schematic diagrams showing intermediate states in the temperature-siring process. That is, FIG. 10A is a graph diagram showing the AB portion of FIG. 12A or JK portion of 13A in an enlarged scale, and FIG. 10B is a graph diagram showing the GH portion of FIG. 12B or MN portion of 13B in an enlarged scale.

In FIG. 10A, the point a corresponds to the amorphous state, and the point B corresponds to the crystal state. Points between the points A and B correspond to intermediate states X1, X2, . . . Xn. The intermediate states X1 through Xn can be realized by adjusting the voltage applied to the cell and the powering time.

In the intermediate states X1 through Xn, the storage cell is between the point A and the point B. One of their specific structures is the state where the amorphous matrix surrounds minute crystal grains, and the size or density of crystal grains is increasing from the state X1 toward the state Xn. Another of the specific structures is the state where crystal pillars or cylindrical crystal cylinders are formed to substantially communicate upper and lower portions of the cell, and amorphous cylinders surround the crystal pillars, or amorphous pillars exist in crystal cylinders, and the cross-sectional area of the crystal pillars or crystal cylinders along the XY plane is increasing from X1 toward Xn.

On the other hand, in FIG. 10B, the point G in corresponds to the amorphous state, and the point H corresponds to the crystal state. Points between the points G and H are intermediate states Xn, . . . X2, X1. The intermediate states from Xn to X1 can be also realized by adjusting the applying voltage of the pulse to be applied to the cell and the powering time.

Also in this embodiment, many-value recording can, be realized by using the intermediate states in the rising-rising process as shown in FIGS. 10A and 10B. For example, any intermediate state may be recorded for example, by interrupting the pulse in a mid point between the points A and B or in a mid point between the points G and H. In this case, recording of intermediate states is possible without intentionally adjusting the trailing edge of the pulse. However, for overwrite recording, but it is more preferable that, according to this embodiment, the trailing edge of the pulse is adjusted in accordance with the crystal state after recording.

Intermediate recording according to the embodiment can be executed in any point between the points A and B shown in FIG. 10A, between the points G and H shown in FIG. 10B or between the points M and N shown in FIG. 9B. However, for the purpose of overwrite recording in a predetermined state, whichever state the storage cell takes before recording, it is advantageous to employ a mode that once melts the cell in the recording process. By using such a recording mode, the cell can be recorded in the predetermined intermediate state after its past history is erased (molten).

The temperature-rising process before melting may be any of a→a transition of FIG. 12a, c→a transition of FIG. 12B, a→c transition of FIG. 9A and c→c transition of FIG. 9B. It is the essential point to adjust the duration of time for the cell to be held in the temperature range lower than Tm and not lower than Tx in its cooling process by way of the trailing curve of the pulse.

The pulse used for intermediate recording may be one having the waveform similar to that shown in FIG. 8B, 8C or 8D. That is, in case of a recording pulse having the waveform shown in FIG. 8B, the trailing time of the pulse may be adjusted. In case of a recording pulse having the waveform shown in FIG. 8C, the lasting time of the voltage in the intermediate level may be adjusted. In case of a recording pulse having the waveform shown in FIG. 8D, length or height of a subsequent intermediate pulse may be adjusted, for example. In any mode of adjustment shown above, if the time or length of the pulse is short, an intermediate state in a higher amorphous level can be obtained. If the time or length of the pulse is long, an intermediate state in a higher crystallization level is obtained.

Figure 11:
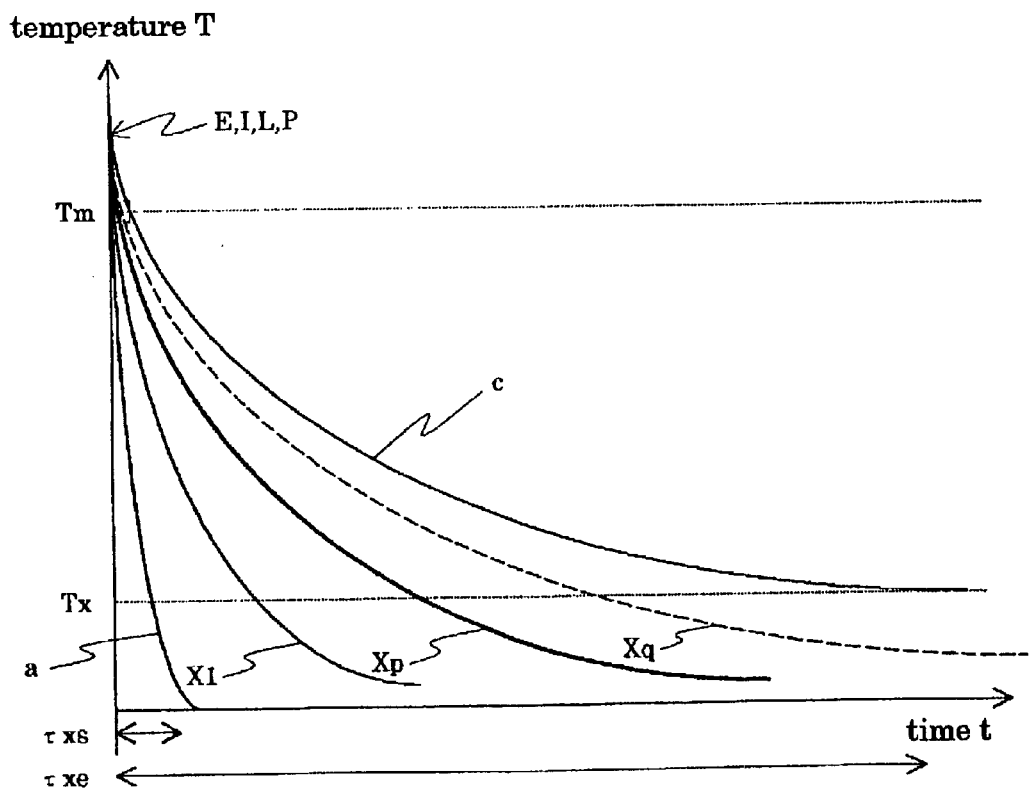
FIG. 11 is a graph diagram showing τxs and txe in relation with the cell temperature in the course of cooling when the trailing end is adjusted.

FIG. 11 is a graph diagram showing τxs and τxe in relation with the cell temperature in the course of cooling when the trailing end is adjusted. The abscissa indicates the time, and the ordinate indicates the temperature. The point denoted as E, I, L and P on the temperature axis means that it can be any point in FIGS. 12A, 12B and FIGS. 9A, 9B.

By adjusting the trailing curve of the pulse, the cooling curve of the cell can be changed freely from any of the points E, I, L and P. The curve a in FIG. 11 shows a cooling curve for changing the cell to a substantially complete amorphous state, and the curve c demonstrates the cooling curve for changing the cell to a substantially complete crystal state.

That is, if the cell is cooled more rapidly than the curve a, then the amorphous state is obtained. If the cell is more slowly than the curve c, then the crystal state is obtained.

In the curve a, the duration time in which the temperature is held in the range lower than Tm and not lower than Tx is substantially equal to τxs. In the curve c, the duration of time in which the temperature is held in the range lower than Tm and not lower than Tx is substantially equal to τxe.

Curves X1, Xp, Xq in FIG. 11 correspond to specific examples of transition to intermediate states, and in any of these cases, the time in which the temperature is held in the range lower than Tm and not lower than Tx is longer than τxs but shorter than τxe. That is, in these specific examples, recording to an intermediate state is carried out, and the crystallization level of the storage cell becomes higher in the order of the curves X1, Xp and Xq.

The above-explained specific example is an intermediate state recording method suitable for overwrite recording. However, as explained in conjunction with the first embodiment, in case of combining it with a recording method for reproducing the current state of the cell before recording, by adjusting the trailing edge from an appropriate position between A and B or between G and H in FIGS. 10A and 10B, transition to any desired intermediate state, amorphous state or crystal state can be executed freely.

Heretofore, some embodiments of the invention have been explained with reference to some specific examples. The invention, however, is not limited to these specific examples. For example, as to waveforms of reading pulses for reading storage states of storage cells, relations of heights or the widths between reading pulse and recording pulse, distances between reading pulses and recording pulses, etc., any modifications should be construed to be contemplated by the invention, as far as any person skilled in the art can employ them and can thereby obtain the same functions and effects as those of embodiments of the invention.

Additionally, regarding specific configurations of the driver circuits for generating these reading pulses and recording pulses and giving them to storage cells, all configurations embodied by persons skilled in the art by using known circuit techniques are also within the scope of the invention.

Furthermore, in regard to relations of connection of the memory array of the storage device, specific configurations of the driver circuits, or configurations, sizes or materials of individual components forming the storage cells, the invention contemplates any modifications employed by persons skilled in the art as far as their functions and effects are the same as those of the invention.

The phase-change materials, as well, are not limited to the above-mentioned specific examples, and any materials having a plurality of phases different in resistance value can be similarly used to obtain the same functions and effects and are involved in the scope of the invention to that extent.

As described above, the invention can overcome the problem that overwrite recording was difficult in conventional nonvolatile solid memory devices using phase-change storage cells. Thus the invention greatly contributes to a remarkable technical progress in replacing DRAM, SRAM, HDD and other various kinds of storage devices with phase-change nonvolatile storage devices to put it into practical use as a universal memory.

Moreover, the invention makes it possible to omit useless writing in case the storage state need not change, by reading the state of the storage cell prior to writing, and can realize quick and low power-consuming PRAM.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A drive circuit which drives a phase-change nonvolatile storage device which has a storage cell including a phase-change material variable in phase between a crystal state and an amorphous state, and changes at least a part of said phase-change material of said storage cell in phase between said crystal state and said amorphous state to record information as a first record state corresponding to said crystal state or a second record state corresponding to said amorphous state, said drive circuit comprising:
a signal generator which generates a first record signal which changes said storage cell from said first record state to said second record state, and a second record signal which changes said storage cell from said second record state to said first record state; and
a reading circuit which reads the record state of said storage cell before recording information in said storage cell,
said drive circuit applying said first record signal to said storage cell when said storage cell is in said first record state and should be changed to said second record state, and
said drive circuit applying said second record signal to said storage cell when said storage cell is in said second record state and should be changed to said first record state.

2. A drive circuit according to claim 1, wherein one of said first and second record signals is a constant-voltage signal, and the other of said first and second record signals is a constant-current signal.

3. A drive circuit according to claim 1, wherein said first record signal is a constant-voltage signal, and said second record signal is a constant-current signal.

4. A drive circuit according to claim 1, wherein said reading circuit reads the record state of said storage cell before recording information in said storage cell, and if a record state of said storage cell read out before recording is the same record state as that to be recorded, said drive circuit maintains said state of the storage cell.

5. A drive circuit according to claim 1, wherein
said phase-change nonvolatile storage device is able to form a third record state different from said first record state and said second record state by forming an intermediate state of a mixture of said crystal state and said amorphous sate at least in a part of said phase-change material of said storage cell,
said signal generator generates a third record signal which changes said storage cell from said first record state to said third record state, and a fourth record signal which changes said storage cell from said second record state to said third record state,
said drive circuit applies said third record signal to said storage cell when said storage cell is in said first record state and should be changed to said third record state, and
said drive circuit applies said fourth record signal to said storage cell when said storage cell is in said second record state and should be changed to said third record state.

6. A drive circuit according to claim 1, wherein
said drive circuit applies a first record signal pulse to said storage cell when at least a part of said phase-change material of said storage cell should be changed to said amorphous state,
said drive circuit applies a second record signal pulse to said storage cell when at least a part of said phase-change material of said storage cell should be changed to said crystal state, and
said first and second record signal pulses are different in waveform of the trailing edge.

7. A drive circuit according to claim 6, wherein said trailing edge of said first record signal pulse is shorter than the trailing edge of said second record signal pulse.

8. A drive circuit according to claim 6, wherein said trailing edge of said first record signal pulse is adjusted such that the crystallization hold time while said phase-change material of said storage cell cools after being heated by said first record signal pulse becomes shorter than the crystallization start time of said phase-change material, and
said trailing edge of said second record signal pulse is adjusted such that the crystallization hold time while said phase-change material of said storage cell cools after being heated by said second record signal pulse is not shorter than the crystallization-completing time of said phase-change material.

9. A drive circuit according to claim 6, wherein said phase-change nonvolatile storage device is able to form a third record state different from said first record state and said second record state by forming an intermediate state of a mixture of said crystal state and said amorphous state at least in a part of said phase-change material of said storage cell,
said drive circuit applies a third record signal pulse to said storage cell to set at least a part of said phase-change material of said storage cell in said intermediate state after melting when said storage cell should be set in said third record state, and
said first record signal pulse and said third record signal pulse are different in waveform of the trailing edge.

10. A phase-change nonvolatile storage device comprising:
a storage cell including a phase-change material variable in phase between a crystal state and an amorphous state, and changes at least a part of said phase-change material of said storage cell in phase between said crystal state and said amorphous state to record information as a first record state corresponding to said crystal state or a second record state corresponding to said amorphous state; and
a drive circuit which drives said storage cell,
said drive circuit having:
a signal generator which generates a first record signal which changes said storage cell from said first record state to said second record state, and a second record signal which changes said storage cell from said second record state to said first record state; and
a reading circuit which reads the record state of said storage cell before recording information in said storage cell,
said drive circuit applying said first record signal to said storage cell when said storage cell is in said first record state and should be changed to said second record state, and
said drive circuit applying said second record signal to said storage cell when said storage cell is in said second record state and should be changed to said first record state.

11. A phase-change nonvolatile storage device according to claim 10, wherein one of said first and second record signals is a constant-voltage signal, and the other of said first and second record signals is a constant-current signal.

12. A phase-change nonvolatile storage device according to claim 10, wherein said first record signal is a constant-voltage signal, and said second record signal is a constant-current signal.

13. A phase-change nonvolatile storage device according to claim 10, wherein said reading circuit reads the record state of said storage cell before recording information in said storage cell, and if a record state of said storage cell read out before recording is the same record state as that to be recorded, said drive circuit maintains said state of the storage cell.

14. A phase-change nonvolatile storage device according to claim 10, wherein
said phase-change nonvolatile storage device is able to form a third record state different from said first record state and said second record state by forming an intermediate state of a mixture of said crystal state and said amorphous sate at least in a part of said phase-change material of said storage cell,
said signal generator generates a third record signal which changes said storage cell from said first record state to said third record state, and a fourth record signal which changes said storage cell from said second record state to said third record state,
said drive circuit applies said third record signal to said storage cell when said storage cell is in said first record state and should be changed to said third record state, and
said drive circuit applies said fourth record signal to said storage cell when said storage cell is in said second record state and should be changed to said third record state.

15. A phase-change nonvolatile storage device according to claim 10, wherein
said drive circuit applies a first record signal pulse to said storage cell when at least a part of said phase-change material of said storage cell should be changed to said amorphous state,
said drive circuit applies a second record signal pulse to said storage cell when at least a part of said phase-change material of said storage cell should be changed to said crystal state, and
said first and second record signal pulses are different in waveform of the trailing edge.

16. A phase-change nonvolatile storage device according to claim 15, wherein said trailing edge of said first record signal pulse is shorter than the trailing edge of said second record signal pulse.

17. A phase-change nonvolatile storage device according to claim 15, wherein
said trailing edge of said first record signal pulse is adjusted such that the crystallization hold time while said phase-change material of said storage cell cools after being heated by said first record signal pulse becomes shorter than the crystallization start time of said phase-change material, and
said trailing edge of said second record signal pulse is adjusted such that the crystallization hold time while said phase-change material of said storage cell cools after being heated by said second record signal pulse is not shorter than the crystallization-completing time of said phase-change material.

18. A phase-change nonvolatile storage device according to claim 15, wherein said phase-change nonvolatile storage device is able to form a third record state different from said first record state and said second record state by forming an intermediate state of a mixture of said crystal state and said amorphous state at least in a part of said phase-change material of said storage cell, said drive circuit applies a third record signal pulse to said storage cell to set at least a part of said phase-change material of said storage cell in said intermediate state after melting when said storage cell should be set in said third record state, and said first record signal pulse and said third record signal pulse are different in waveform of the trailing edge.

* * * * *